(12) United States Patent
Ohta et al.

(10) Patent No.: US 6,560,053 B1
(45) Date of Patent: May 6, 2003

(54) CLOCK RECOVERY APPARATUS

(75) Inventors: Haruo Ohta, Hirakata (JP); Yoshikazu Katoh, Katano (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/549,586

(22) Filed: Apr. 14, 2000

(30) Foreign Application Priority Data

Apr. 16, 1999 (JP) .............................. 11-110057

(51) Int. Cl.[7] ................................. G11B 5/09
(52) U.S. Cl. ............................ 360/51; 360/26
(58) Field of Search ............................ 360/51, 53, 54, 360/26

(56) References Cited

U.S. PATENT DOCUMENTS 5,552,942 A * 9/1996 Ziperovich et al. ........... 360/51
5,841,323 A * 11/1998 Fujimoto ..................... 331/11
6,141,163 A * 10/2000 Nakamura et al. ............ 360/51

OTHER PUBLICATIONS

Jenn–Gang Chem, et al. "An EPRML Digital Read/Write Channel IC" 1997, IEEE International Solid–State Circuit Conference, Digest of Technical Papers, SA 19.4 (Feb. 1997).

Roy D. Cideciyan et al., "A PRML System for Digital Magnetic Recording", IEEE Journal on Selected Areas in Communications, Vo., 10, No. 1 (Jan. 1992).

* cited by examiner

Primary Examiner—David Hudspeth
Assistant Examiner—Varsha A. Kapadia
(74) Attorney, Agent, or Firm—Wenderoth, Lind & Ponack, L.L.P.

(57) ABSTRACT

A reproduction signal 10 is processed in an AD converter 4 and an equalizer 16 to be a decoder input signal 12. The decoder input signal 12 is used to calculate a phase error signal 25 and a quality judgement signal 26. A phase-frequency error detection circuit 22 retains a sign of the phase error signal 25 obtained when the quality judgement signal 26 is changed in quality from "good" to "bad". The phase-frequency error detection circuit 22 then outputs, as a phase-frequency error signal 27, the phase error signal 25 when the signal quality is "good", and a given value corresponding to the retained sign when the signal quality is "bad". A voltage controlled oscillator 9 generates a recovered clock signal 11 whose frequency is based on the oscillation control signal 15 generated by the phase-frequency error signal 27.

14 Claims, 18 Drawing Sheets

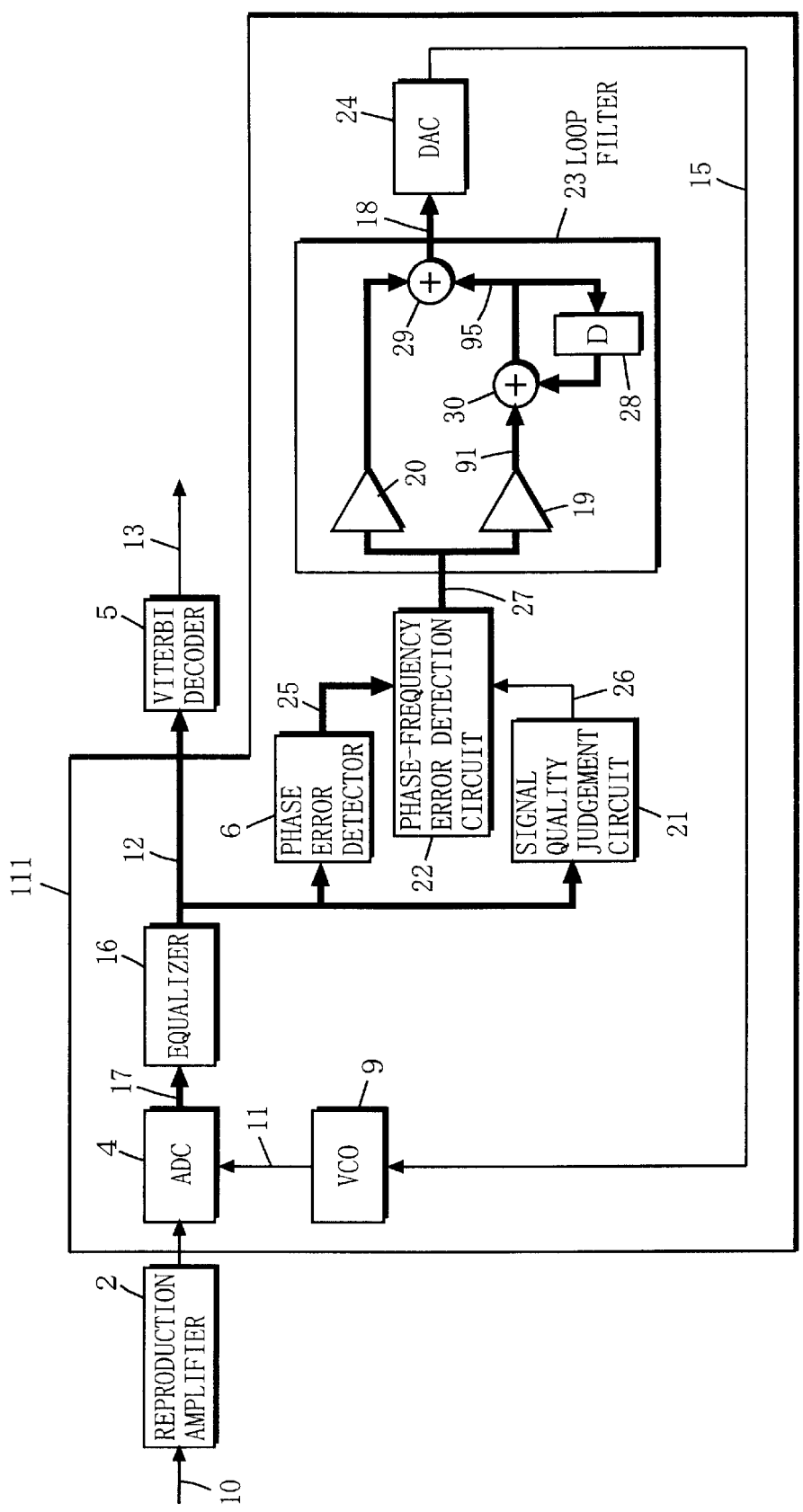

F I G. 2
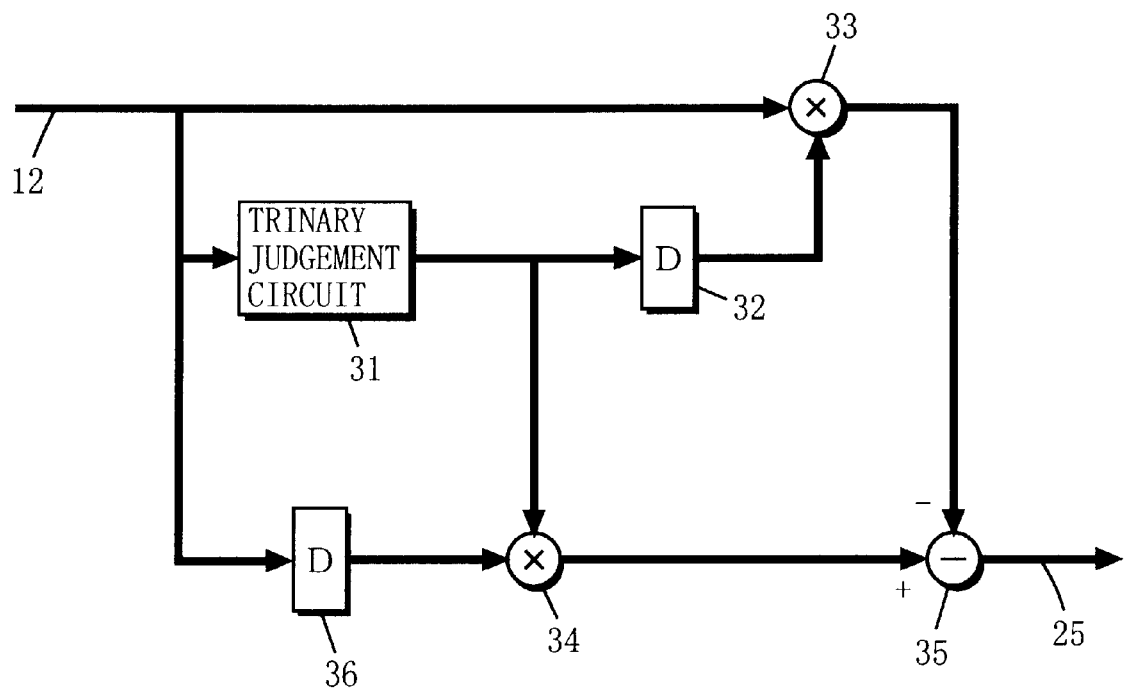
F I G. 3
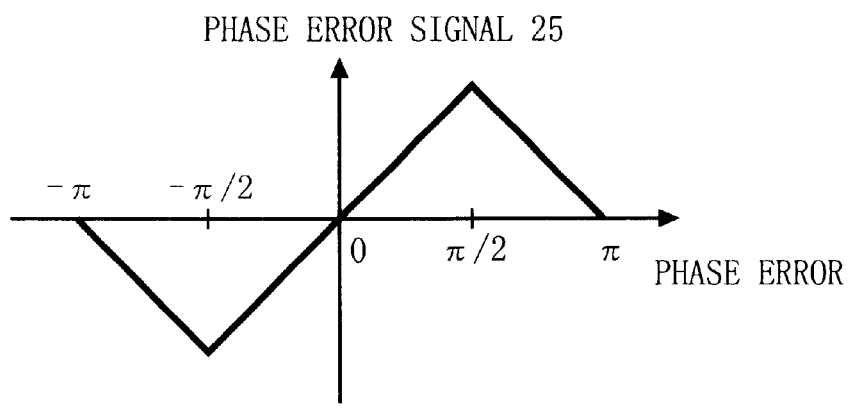

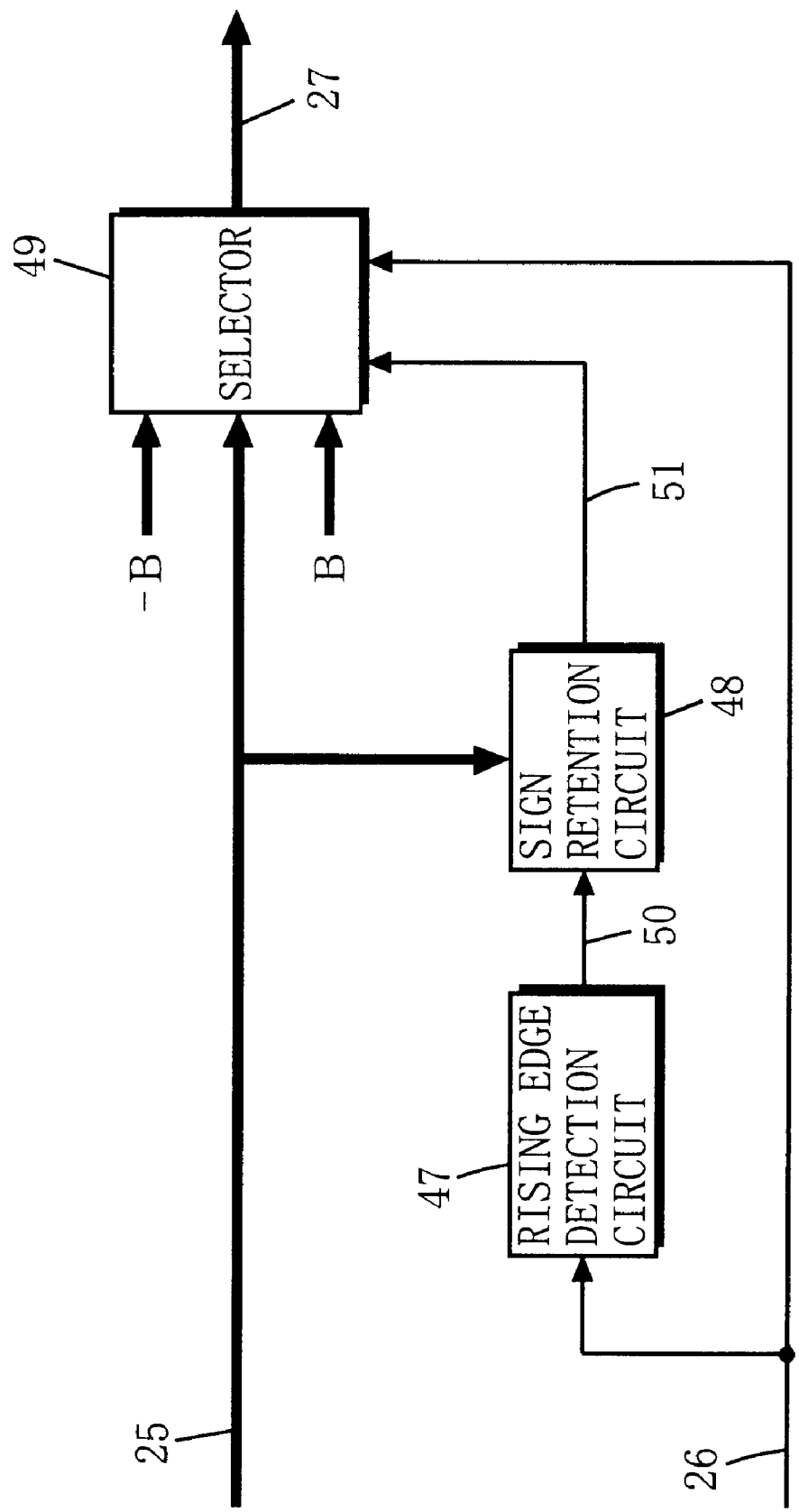
F I G. 5

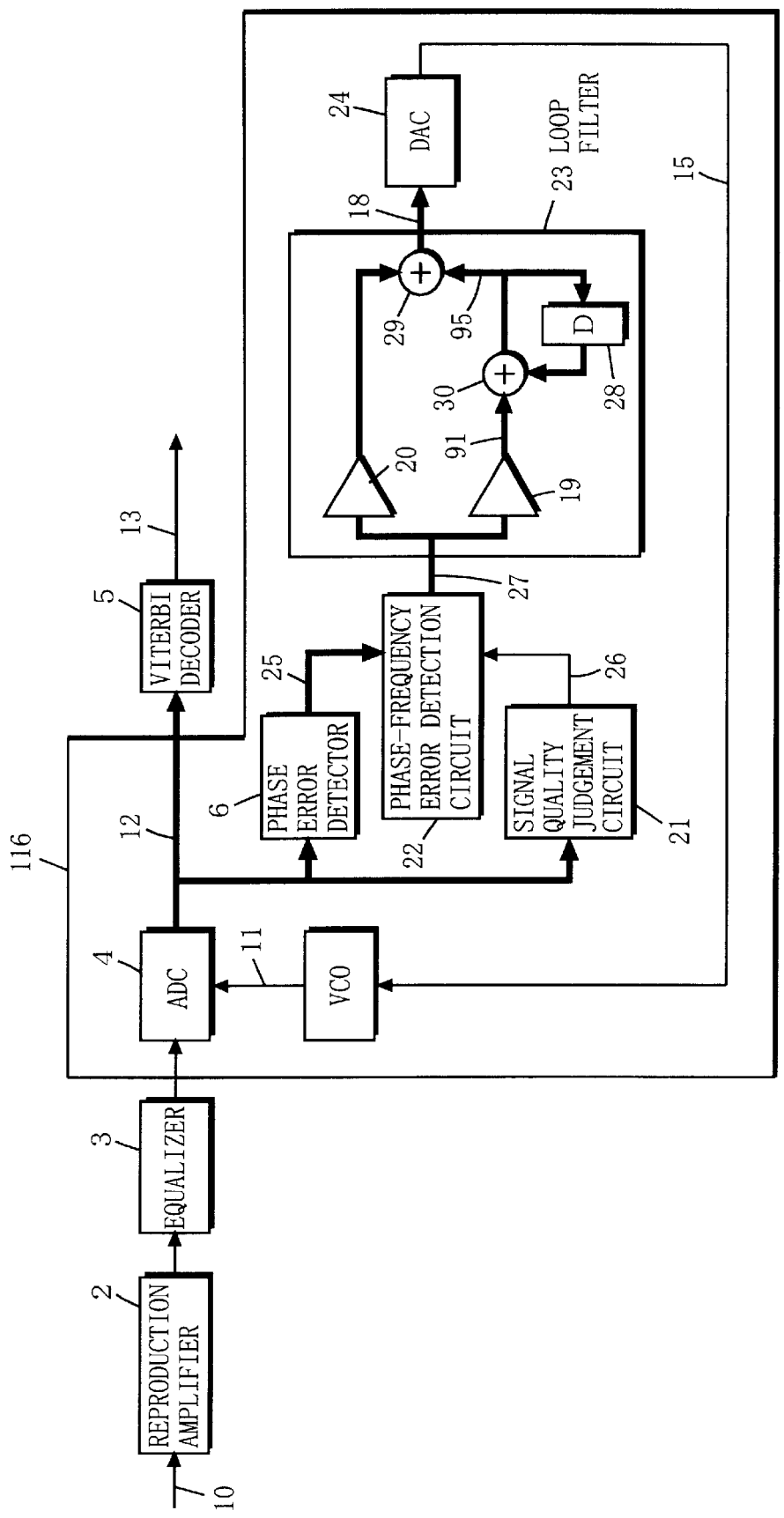
F I G. 1 8

CLOCK RECOVERY APPARATUS

BACKGROUND OF THE INVENTION

1. Field of the Invention

The present invention relates to a clock recovery apparatus for recovering a clock signal used to reproduce digital data from an incoming signal.

2. Description of the Background Art

In a signal reproduction apparatus for reproducing digital data from an incoming signal, a clock recovery apparatus for recovering a clock signal synchronized with the reproduced digital data is incorporated therein. In the signal reproduction, the incoming signal is exemplarily sampled with a timing of the recovered clock signal. Hereinafter, a clock signal suitable for reproducing digital data, in other words, an ideal clock signal for the clock recovery apparatus is referred to as data clock, while an actual clock signal is referred to as recovered clock signal.

In the signal reproduction apparatus such as hard disk drive or magnetic tape drive, a signal reproduced from a recording medium is supplied as an incoming signal. In such an apparatus, a PRML (Partial Response Maximum Likelihood) method is applied to record and reproduce digital data. In the signal reproduction apparatus applying the PRML method therein, the reproduction signal is first subjected to partial response equalization and then to most likelihood decoding by going through a Viterbi decoder, for example. In this manner, digital data recorded on the recording medium is reproduced. A description is provided next about a conventional reproduction signal processing part of the signal reproduction apparatus applying the PRML method therein. In FIGS. 19 and 20, a thinner arrow-headed signal line indicates an analog signal or a one-bit digital signal, while a thicker arrow-headed signal line indicates a digital signal including two or more bits.

FIG. 19 is a block diagram showing the structure of a reproduction signal processing part into which a first conventional clock recovery apparatus is incorporated. Such structure is found exemplarily in Jenn-Gang Chem, et al. "An EPRML Digital Read/Write Channel IC" 1997 IEEE International Solid-State Circuits Conference, Digest of Technical Papers, SA19.4 (February 1997). In the reproduction signal processing part shown in FIG. 19, a reference numeral 101 denotes the clock recovery apparatus. A reproduction signal 10 is a signal reproduced from a recording medium such as magnetic disk or magnetic tape. On the reproduction signal 10, digital data synchronized with a data clock is presumably recorded. The reproduction signal 10 is amplified in a reproduction amplifier 2, and the amplified signal is subjected to partial response equalization in an equalizer 3. An output signal from the equalizer 3 is forwarded to an AD converter 4, and is sampled and quantized therein with timing of a recovered clock signal 11 to be a decoder input signal 12. The decoder input signal 12 is subjected to most likelihood decoding in a Viterbi decoder 5 according to Viterbi algorithm, and a result obtained thereby is outputted as reproduction data 13. The reproduction data 13 is regarded as data reproduced by the signal reproduction apparatus.

The decoder input signal 12 is forwarded also to a phase error detector 6. Being provided with the decoder input signal 12, the phase error detector 6 outputs a phase error signal 14 to a DA converter 7. The phase error signal 14 indicates a difference in phase (hereinafter, phase error) between the data clock and the recovered clock signal 11.

The phase error signal 14 is converted to an analog signal by the DA converter 7. The analog signal is then forwarded to a loop filter 8 to be an oscillation control signal 15. The oscillation control signal 15 is forwarded to a VCO (Voltage Controlled Oscillator) 9. The VCO 9 oscillates according to a frequency controlled by the oscillation control signal 15, and generates the recovered clock signal 11. The recovered clock signal 11 is used as a sampling clock in the AD converter 4. In the first conventional clock recovery apparatus 101, the recovered clock signal 11 phase-locked to the data clock is generated by a PLL (Phase Locked Loop) circuit by a feed-back loop including the AD converter 4, the phase error detector 6, the DA converter 7, the loop filter 8, and the VCO 9.

In the first conventional clock recovery apparatus 101, the equalizer 3 where partial response equalization is performed on the reproduction signal is an analog circuit. For equalization processing with high accuracy and no adjustment, or in an LSI chip, a digital equalizer is preferable. FIG. 20 is a block diagram showing the structure of a reproduction signal processing part into which a second conventional clock recovery apparatus is incorporated. In the reproduction signal processing part shown in FIG. 20, a reference numeral 102 denotes the clock recovery apparatus. Herein, unlike the first conventional clock recovery apparatus 101 where the analog equalizer 3 performs partial response equalization before AD conversion, a digital equalizer 16 performs partial response equalization after AD conversion. In the second conventional clock recovery apparatus 102, the recovered clock signal 11 phase-locked to the data clock is generated by a PLL circuit structured by a feed-back loop including the AD converter 4, the equalizer 16, the phase error detector 6, the DA converter 7, the loop filter 8, and the VCO 9.

It is preferable, for the PLL circuit in such a clock recovery apparatus, that a range of the maximum difference in frequency between the data clock and the recovered clock signal 11 (hereinafter, pull-in range) is wider. With a wide pull-in range, these two clocks come to be locked even if not being locked at first. The problem herein is, although being structurally more preferable than the first clock recovery apparatus 101, the clock recovery apparatus 102 has a considerably narrower pull-in range. The reason is as follows: since the equalizer 16 is a digital circuit, the equalizer 16 internally delays the signal 17 on a clock period basis, and accordingly comprehensive delay in the feed-back loop in the PLL circuit is increased. Consequently, the recovered clock signal 11 is delayed being controlled by a phase error between the data clock and the recovered clock signal 11. Such problem becomes evident in the magnetic tape drive where frequency variation of the reproduction signal is wide. Consequently, such a magnetic tape drive cannot employ the second structure in FIG. 20, and thus the equalization processing therein cannot be highly accurate or adjustment-free, or carried out in an LSI chip.

SUMMARY OF THE INVENTION

Therefore, an object of the present invention is to provide a clock recovery apparatus whose pull-in range remains wider even if a delay in a feed-back loop in a PLL circuit is lengthened. Further, another object of the present invention is to provide a clock recovery apparatus, with a wider pull-in range, being capable of performing partial response equalization in digital processing, and equalization processing with high accuracy, no adjustment, and in an LSI chip.

The present invention has the following features to attain the objects above.

A first aspect of the present invention is directed to a clock recovery apparatus for recovering a clock signal used to reproduce digital data from an incoming signal, the device comprising: an oscillation part for receiving a control signal, and generating, as an oscillation clock signal, a clock signal whose frequency is based on the control signal; a sampling part for sampling the incoming signal with timing of the oscillation clock signal, and outputting a sampled value of the incoming signal; a phase error detection part for detecting, based on the sampled value, a phase error between the oscillation clock signal and an ideal clock signal used to reproduce the digital data; a quality judgement part for judging quality of the sampled incoming signal by referring to the sampled value; a phase-frequency error detection part for outputting a phase-frequency error signal based on the phase error and the quality judged by the quality judgement part; and a filter part for smoothing the phase-frequency error signal for output to the oscillation part as the control signal, wherein the oscillation clock signal is outputted as the clock signal used to reproduce the digital data.

As described above, in the first aspect, the frequency of the oscillation clock signal is controlled according to the phase error obtained by the phase error detection part and the phase-frequency error obtained from the judgement made by the quality judgement part. In this manner, it becomes possible to provide a clock recovery apparatus with a wider pull-in range, in which the data clock and the recovered clock signal differing in frequency coincide with each other in both frequency and phase. Further, since a digital equalizer can be provided in the feed-back loop in the PLL circuit, the equalization processing in the clock recovery apparatus can be highly accurate, adjustment-free, or carried out in an LSI chip.

According to a second aspect, in the first aspect, the quality judgement part comprises: a temporary judgement part for estimating the digital data based on the sampled value for output as a temporary judgement result; a reference value generation part for generating a reference value based on the temporary judgement result; and a calculation part for calculating a difference between the sampled value and the reference value, wherein the quality is judged according to the difference.

As described above, in the second aspect, the signal quality can be judged according to the difference between the sampled value and the reference value based on the sampled value.

According to a third aspect, in the second aspect, the reference value generation part generates the reference value which is corresponding to a change in amplitude of the sampled incoming signal.

As described above, in the third aspect, the reference value in the quality judgement part changes corresponding to the change in amplitude of the incoming signal. Therefore, it becomes possible to provide a recovery clock device in which the data clock and the recovered clock signal coincide with each other in both frequency and phase even if the amplitude of the incoming signal varies to a greater degree with the passage of time.

According to a fourth aspect, in the second aspect, the quality judgement part compares a value based on an absolute value of the difference with a given threshold value, and accordingly judges the quality.

As described above, in the fourth aspect, the signal quality can be judged according to the absolute value of the difference between the sampled value and the reference value based on the sampled value.

According to a fifth aspect, in the second aspect, the quality judgement part compares a value based on a square of the difference with a given threshold value, and accordingly judges the quality.

As described above, in the fifth aspect, the signal quality can be judged according to the square of the difference between the sampled value and the reference value based on the sampled value.

According to a sixth aspect, in the second aspect, the quality judgement part includes a low pass filter, compares a value obtained after the difference goes through the low pass filter with a given threshold value, and accordingly judges the quality.

As described above, in the sixth aspect, the quality of the incoming signal is judged according to a value obtained after the difference goes through the low pass filter. Therefore, it becomes possible to provide a clock recovery apparatus in which the data clock and the recovered clock signal coincide with each other, with accuracy, in both frequency and phase without being affected by any noise supposedly included in the incoming signal.

According to a seventh aspect, in the first aspect, according to the judgement made by the quality judgement part, the phase-frequency error detection part takes in, for retention, a sign of the phase error every time the quality changes from good to bad, and when the quality is good, outputs the phase error, but when the quality is bad, outputs a given error value corresponding to the retained sign.

As described above, in the seventh aspect, the error value is equal to the given value which is determined by a sign retained when the quality changed to be bad. Therefore, it becomes possible to provide a clock recovery apparatus in which the data clock and the recovered clock signal coincide with each other, with accuracy, both in frequency and phase.

According to an eighth aspect, in the first aspect, the phase-frequency error detection part includes a phase error filter part for smoothing the phase error, and takes in, for retention, a sign of an output signal of the phase error filter part every time the quality changes from good to bad, and when the quality is good, outputs the phase error, but when the quality is bad, outputs a given error value corresponding to the retained sign.

As described above, in the eighth aspect, the quality of the incoming signal is judged according to the phase error after the phase error filter part. Therefore, it becomes possible to provide a clock recovery apparatus in which the data clock and the recovered clock signal coincide with each other, with accuracy, in both frequency and phase without being affected by any noise supposedly included in the incoming signal.

According to a ninth aspect, in the first aspect, the phase-frequency error detection part includes a phase error filter part for smoothing the phase error, and according to the judgement made by the quality judgement part, takes in, for retention, a sign of an output signal of the phase error filter part every time the quality changes from good to bad, and when the quality is good, outputs the phase error, but when the quality is bad, outputs a given error value according to the retained sign for a given duration of time right after the quality is judged as being bad.

As described above, in the ninth aspect, the quality of the incoming signal is judged according to the phase error after the phase error filter part. Therefore, it becomes possible to provide a clock recovery apparatus in which the data clock and the recovered clock signal coincide with each other, with accuracy, in both frequency and phase without being affected by any noise supposedly included in the incoming signal. Further, therein, the frequency of the recovered clock signal may not be erroneously shifted to a greater degree from that of the data clock. This is because, the duration of the quality being bad is limited to a given time.

According to a tenth aspect, in the first aspect, the filter part includes an integration part for integrating the phase-frequency error signal outputted from the phase-frequency error detection part.

As described above, in the tenth aspect, it becomes possible to provide a clock recovery apparatus in which the frequency of the recovered clock signal generated by the oscillation part gradually changes with respect to the change of the detected phase-frequency error.

According to an eleventh aspect, in the first aspect, the sampling part includes an equalization part for equalizing the incoming signal sampled by the oscillation clock signal for output as the sampled value.

A twelfth aspect is directed to a clock recovery apparatus for recovering a clock signal used to reproduce digital data from an incoming signal, the device comprising: an oscillation part for receiving a control signal, and generating, as an oscillation clock signal, a clock signal whose frequency is based on the control signal; a sampling part for sampling the incoming signal with timing of the oscillation clock signal, and outputting a sampled value of the incoming signal; a phase error detection part for detecting, based on the sampled value, a phase error between the oscillation clock signal and the clock signal used to reproduce the digital data; a frequency error detection part for detecting a difference between a frequency of the oscillation clock signal and a given reference frequency as a frequency error; a phase-frequency error detection part for outputting a phase-frequency error signal based on the phase error and the frequency error; and a filter part for smoothing the phase-frequency error signal for output to the oscillation part as the control signal, wherein the oscillation clock signal is outputted as the clock signal used to reproduce the digital data.

As described above, in the twelfth aspect, the frequency of the oscillation clock signal is controlled according to the phase error obtained by the phase error detection part and the phase-frequency error obtained from the frequency error outputted from the frequency error detection part. In this manner, it becomes possible to provide a clock recovery apparatus whose pull-in range is wider than the first aspect, and accordingly the effects by the first aspect becomes more apparent.

According to a thirteenth aspect, in the twelfth aspect, when an absolute value of the frequency error is larger than a given threshold value, the phase-frequency error detection part outputs a given error value having a sign identical to that of the frequency error, and when the absolute value of the frequency error is smaller than the threshold value, the phase-frequency error detection part outputs the phase error.

As described above, in the thirteenth aspect, when the absolute value of the frequency error is larger than the given threshold value, the frequency of the oscillation clock signal is controlled according to the given error value having a sign identical to that of the frequency error. Therefore, a clock recovery apparatus can be provided, in which the data clock and the recovered clock signal coincide with each other, with accuracy, in both frequency and phase.

According to a fourteenth aspect, in the twelfth aspect, the frequency error detection part includes a count part for counting the oscillation clock signals generated during a given time, and outputs a difference between a count value obtained by the count part and a given expected value as the frequency error.

As described above, in the fourteenth aspect, the frequency error can be detected with high accuracy. Accordingly, a clock recovery apparatus can be provided, in which the data clock and the recovered clock signal coincide with each other, with accuracy, in both frequency and phase.

According to a fifteenth aspect, in the twelfth aspect, the filter part includes an integration part for integrating the phase-frequency error signal outputted from the phase-frequency error detection part.

As described above, in the fifteenth aspect, it becomes possible to provide a clock recovery apparatus in which the frequency of the recovered clock signal generated by the oscillation part gradually changes with respect to the change of the detected phase-frequency error.

According to a sixteenth aspect, in the twelfth aspect, the sampling part includes an equalization part for equalizing the incoming signal sampled by the oscillation clock signal for output as the sampled value.

As described above, in the sixteenth aspect, it becomes possible to provide a clock recovery apparatus which can be incorporated into a signal reproduction processing part in the signal reproduction apparatus applying PRML method.

A seventeenth aspect of the present invention is directed to a clock recovery apparatus for recovering a clock signal used to reproduce digital data from an incoming signal, the device comprising: an oscillation part for receiving a control signal, and generating, as an oscillation clock signal, a clock signal whose frequency is based on the control signal; a sampling part for sampling the incoming signal with timing of the oscillation clock signal, and outputting a sampled value of the incoming signal; a phase error detection part for detecting, based on the sampled value, a phase error between the oscillation clock signal and the clock signal used to reproduce the digital data; a quality judgement part for judging quality of the sampled incoming signal by referring to the sampled value; a frequency error detection part for detecting a difference between a frequency of the oscillation clock signal and a given reference frequency as a frequency error; a phase-frequency error detection part for outputting a phase-frequency error signal based on the phase error, the quality judged by the quality judgement part, and the frequency error; and a filter part for smoothing the phase-frequency error signal for output to the oscillation part as the control signal, wherein the oscillation clock signal is outputted as the clock signal used to reproduce the digital data.

As described above, in the seventeenth aspect, the frequency of the oscillation clock signal is controlled according to the phase error obtained by the phase error detection part, the judgement made by the quality judgement part, and the frequency error obtained by the frequency error detection part. In this manner, it becomes possible to provide a clock recovery apparatus whose pull-in range is wider than the first aspect, and in which the frequency error detection part can be easily implemented.

According to an eighteenth aspect, in the seventeenth aspect, the quality judgement part comprises: a temporary judgement part for estimating the digital data based on the sampled value for output as a temporary judgement result; a reference value generation part for generating a reference value based on the temporary judgement result; and a calculation part for calculating a difference between the sampled value and the reference value, wherein the quality is judged according to the difference.

As described above, in the eighteenth aspect, the signal quality can be judged according to the difference between the sampled value and the reference value based on the sampled value.

According to a nineteenth aspect, in the eighteenth aspect, the reference value generation part generates the reference value which is corresponding to a change in amplitude of the sampled incoming signal.

As described above, in the nineteenth aspect, the reference value in the quality judgement part changes corresponding to the change in amplitude of the incoming signal. Therefore, it becomes possible to provide a recovery clock device in which the data clock and the recovered clock signal coincide with each other in frequency and phase even if the amplitude of the incoming signal varies to a greater degree with the passage of time.

According to a twentieth aspect, in the eighteenth aspect, the quality judgement part compares a value based on an absolute value of the difference with a given threshold value, and accordingly determines the quality.

As described above, in the twentieth aspect, the signal quality can be judged according to the absolute value of the difference between the sampled value and the reference value based on the sampled value.

According to a twenty-first aspect, in the eighteenth aspect, the quality judgement part compares a value based on a square of the difference with a given threshold value, and accordingly determines the quality.

As described above, in the twenty-first aspect, the signal quality can be judged according to the square of the difference between the sampled value and the reference value based on the sampled value.

According to a twenty-second aspect, in the eighteenth aspect, the quality judgement part includes a low pass filter, compares a value obtained after the difference goes through the low pass filter with a given threshold value, and accordingly judges the quality.

As described above, in the twenty-second aspect, the quality of the incoming signal is judged according to a value obtained after the difference goes through the low pass filter. Therefore, it becomes possible to provide a clock recovery apparatus in which the data clock and the recovered clock signal coincide with each other, with accuracy, in both frequency and phase without being affected by any noise supposedly included in the incoming signal.

According to a twenty-third aspect, in the seventeenth aspect, according to the judgement made by the quality judgement part, the phase-frequency error detection part takes in, for retention, a sign of the phase error every time the quality changes from good to bad, and when an absolute value of the frequency error is larger than a given threshold value, outputs a given first error value having a sign identical to that of the frequency error, but when the absolute value of the frequency error is smaller than the threshold value, outputs the phase error for a duration of the quality being good, and for a duration of the quality being bad, outputs a given second error value according to the retained sign.

As described above, in the twenty-third aspect, when the absolute value of the frequency error is larger than the given threshold value, the operation is similar to the thirteenth aspect, and if the absolute value of the frequency error becomes smaller than the given threshold value, the operation becomes similar to the seventh aspect. In this manner, it becomes possible to provide a recovery clock device in which the data clock and the recovered clock signal coincide with each other, with accuracy, in frequency and phase.

According to a twenty-fourth aspect, in the seventeenth aspect, the phase-frequency error detection part includes a phase error filter part for smoothing the phase error, and according to the judgement made by the quality judgement part, takes in, for retention, a sign of an output signal of the phase error filter part every time the quality changes from good to bad, and when an absolute value of the frequency error is larger than a given threshold value, outputs a given first error value having a sign identical to that of the frequency error, but when the absolute value of the frequency error is smaller than the threshold value, outputs the phase error for a duration of the quality being good, and for a duration of the quality being bad, outputs a given second error value according to the retained sign.

As described above, in the twenty-fourth aspect, when the absolute value of the frequency error is larger than the given threshold value, the operation is similar to the thirteenth aspect, and if the absolute value of the frequency error becomes smaller than the given threshold value, the operation becomes similar to the eighth aspect. In this manner, it becomes possible to provide a recovery clock device in which the data clock and the recovered clock signal coincide with each other, with accuracy, in frequency and phase without being affected by any noise supposedly included in the incoming signal.

According to a twenty-fifth aspect, in the seventeenth aspect, the phase-frequency error detection part includes a phase error filter part for smoothing the phase error, and according to the judgement made by the quality judgement part, takes in, for retention, a sign of an output signal of the phase error filter part every time the quality changes from good to bad, and when an absolute value of the frequency error is larger than a given threshold value, outputs a given first error value having a sign identical to that of the frequency error, but when the absolute value of the frequency error is smaller than the threshold value, outputs the phase error for a duration of the quality being good, and for a duration of the quality being bad, outputs a given second error value according to the retained sign only for a given duration of time right after the quality is judged as being bad.

As described above, in the twenty-fifth aspect, when the absolute value of the frequency error is larger than the given threshold value, the operation is similar to the thirteenth aspect, and if the absolute value of the frequency error becomes smaller than the given threshold value, the operation becomes similar to the ninth aspect. In this manner, without being affected by any noise supposedly included in the incoming signal, the frequency of the recovered clock signal may not erroneously shifted to a greater degree from that of the data clock. Accordingly, it becomes possible to provide a clock recovery apparatus in which the data clock and the recovered clock signal coincide with each other, with accuracy, in both frequency and phase.

According to a twenty-sixth aspect, in the seventeenth aspect, the frequency error detection part includes a count part for counting the oscillation clock signals generated during a given time, and outputs a difference between a count value obtained by the count part and a given expected value as the frequency error.

As described above, in the twenty-sixth aspect, the frequency error can be detected with high accuracy. Accordingly, a clock recovery apparatus can be provided, in which the data clock and the recovered clock signal coincide with each other, with accuracy, in both frequency and phase.

According to a twenty-seventh aspect, in the seventeenth aspect, the filter part includes an integration part for integrating the phase-frequency error signal from the phase-frequency error detection part.

As described above, in the twenty-seventh aspect, it becomes possible to provide a clock recovery apparatus in which the frequency of the recovered clock signal generated by the oscillation part gradually changes with respect to the change of the detected phase-frequency error.

According to a twenty-eighth aspect, in the seventeenth aspect, the sampling part includes an equalization part for equalizing the incoming signal sampled by the oscillation clock signal for output as the sampled value.

As described above, in the twenty-eighth aspect, it becomes possible to provide a clock recovery apparatus which can be incorporated into a signal reproduction processing part in the signal reproduction apparatus applying PRML method.

A twenty-ninth aspect of the present invention is directed to a clock recovery apparatus for recovering a clock signal used to reproduce digital data from an incoming signal, the device comprising: an oscillation part for receiving a control signal, and generating, as an oscillation clock signal, a clock signal whose frequency is based on the control signal; a sampling part for sampling the incoming signal with timing of the oscillation clock signal, and outputting a sampled value of the incoming signal; a phase error detection part for detecting, based on the sampled value, a phase error between the oscillation clock signal and the clock signal used to reproduce the digital data; a frequency error detection part for detecting a difference between a frequency of the oscillation clock signal and a given reference frequency as a frequency error; a selection part for selecting the phase error when an absolute value of the frequency error is smaller than a given threshold value, and selects the frequency error when the absolute value of the frequency error is larger than the threshold value; an integration part for integrating an output of the selection part; and an addition part for adding the phase error from the phase error detection part and an output of the integration part for output as the control signal to the oscillation part, wherein the oscillation clock signal is outputted as the clock signal used to reproduce the digital data.

As described above, in the twenty-ninth aspect, when the absolute value of the frequency error obtained by the frequency error detection part is larger than the given threshold value, the frequency of the oscillation clock signal is controlled by, instead of the phase error obtained by the phase error detection part, the signal in which the result obtained by integrating the frequency error and the output signal from the phase error detection part are added. Accordingly, it becomes possible to provide a clock recovery apparatus whose pull-in range is wider than the first aspect, and in which the data clock and the recovered clock signal coincide with each other in frequency and phase in a shorter time.

According to a thirtieth aspect, in the twenty-ninth aspect, the frequency error detection part includes a count part for counting the oscillation clock signals generated during a given time, and regards a difference between a count value obtained by the count part and a given expected value as the frequency error.

As described above, in the thirtieth aspect, the frequency error can be detected with high accuracy. Accordingly, a clock recovery apparatus can be provided, in which the data clock and the recovered clock signal coincide with each other, with accuracy, in both frequency and phase.

According to a thirty-first aspect, in the twenty-ninth aspect, the sampling part includes an equalization part for equalizing the incoming signal sampled by the oscillation clock signal for output as the sampled value.

As described above, in the thirty-first aspect, it becomes possible to provide a clock recovery apparatus which can be incorporated into a signal reproduction processing part in the signal reproduction apparatus applying PRML method.

A thirty-second aspect of the present invention is directed to a clock recovery apparatus for recovering a clock signal used to reproduce digital data from an incoming signal, the device comprising: an oscillation part for receiving a control signal, and generating, as an oscillation clock signal, a clock signal whose frequency is based on the control signal; a sampling part for sampling the incoming signal with timing of the oscillation clock signal, and outputting a sampled value of the incoming signal; a phase error detection part for detecting, based on the sampled value, a phase error between the oscillation clock signal and the clock signal used to reproduce the digital data; a quality judgement part for judging quality of the sampled incoming signal by referring to the sampled value; a phase-frequency error detection part for outputting a phase-frequency error signal based on the phase error and the quality judged by the quality judgement part; a frequency error detection part for detecting a difference between a frequency of the oscillation clock signal and a given reference frequency as a frequency error; a selection part for selecting the phase-frequency error signal when an absolute value of the frequency error is smaller than a given threshold value, and selects the frequency error when the absolute value of the frequency error is larger than the threshold value; an integration part for integrating an output of the selection part; and an addition part for adding the phase-frequency error signal from the phase-frequency error detection part and an output of the integration part for output as the control signal to the oscillation part, wherein the oscillation clock signal is outputted as the clock signal used to reproduce the digital data.

As described above, in the thirty-second aspect, when the absolute value of the frequency error obtained by the frequency error detection part is larger than the given threshold value, the frequency of the oscillation clock signal is controlled by, instead of the phase error obtained by the phase error detection part and the judgement made by the quality judgement part, the signal obtained by adding the result obtained by integrating the frequency error and the output signal from the phase-frequency error detection part. Accordingly, it becomes possible to provide a clock recovery apparatus whose pull-in range is wider than the first aspect, and in which the data clock and the recovered clock signal coincide with each other in frequency and phase in a shorter time, and the frequency error detection part can be easily implemented.

According to a thirty-third aspect, in the thirty-second aspect, the quality judgement part comprises: a temporary judgement part for estimating the digital data based on the sampled value for output as a temporary judgement result; a reference value generation part for generating a reference value based on the temporary judgement result; and a calculation part for calculating a difference between the sampled value and the reference value, wherein the quality is judged according to the difference.

As described above, in the thirty-third aspect, the signal quality can be judged according to the difference between the sampled value and the reference value based on the sampled value.

According to a thirty-fourth aspect, in the thirty-third aspect, the reference value generation part generates the reference value which is corresponding to a change in amplitude of the sampled incoming signal.

As described above, in the thirty-fourth aspect, the reference value in the quality judgement part changes corresponding to the change in amplitude of the incoming signal. Therefore, it becomes possible to provide a recovery clock device in which the data clock and the recovered clock signal coincide with each other in frequency and phase even if the amplitude of the incoming signal varies to a greater degree with the passage of time.

According to a thirty-fifth aspect, in the thirty-third aspect, the quality judgement part compares a value based on an absolute value of the difference with a given threshold value, and accordingly determines the quality.

As described above, in the thirty-fifth aspect, the signal quality can be judged according to the absolute value of the difference between the sampled value and the reference value based on the sampled value.

According to a thirty-sixth aspect, in the thirty-third aspect, the quality judgement part compares a value based on a square of the difference with a given threshold value, and accordingly determines the quality.

As described above, in the thirty-sixth aspect, the signal quality can be judged according to the square of the difference between the sampled value and the reference value based on the sampled value.

According to a thirty-seventh aspect, in the thirty-third aspect, the quality judgement part includes a low pass filter, compares a value obtained after the difference goes through the low pass filter with a given threshold value, and accordingly judges the quality.

As described above, in the thirty-seventh aspect, the quality of the incoming signal is judged based on a difference obtained after the difference goes through the low pass filter. In this manner, it becomes possible to provide a clock recovery apparatus in which the data clock and the recovered clock signal coincide with each other, with accuracy, in both frequency and phase without being affected by any noise supposedly included in the incoming signal.

According to a thirty-eighth aspect, in the thirty-second aspect, according to the judgement made by the quality judgement part, the phase-frequency error detection part takes in, for retention, a sign of the phase error every time the quality changes from good to bad, and outputs the phase error when the quality is good but outputs a given error value corresponding to the retained sign when the quality is bad.

As described above, in the thirty-eighth aspect, the error value is equal to the given value which is determined by a sign retained when the quality changed to be bad. Therefore, it become possible to provide a clock recovery apparatus in which the data clock and the recovered clock signal coincide with each other, with accuracy, both in frequency and phase.

According to a thirty-ninth aspect, in the thirty-second aspect, the phase-frequency error detection part includes a phase error filter part for smoothing the phase error, and according to the judgement made by the quality judgement part, takes in, for retention, a sign of an output signal of the phase error filter part every time the quality changes from good to bad, and when the quality is good, outputs the phase error, but when the quality is bad, outputs a given error value corresponding to the retained sign.

As described above, in the thirty-ninth aspect, the quality of the incoming signal is judged according to the phase error after the phase error filter part. Therefore, it becomes possible to provide a clock recovery apparatus in which the data clock and the recovered clock signal coincide with each other, with accuracy, in both frequency and phase without being affected by any noise supposedly included in the incoming signal.

According to a fortieth aspect, in the thirty-second aspect, the phase-frequency error detection part includes a phase error filter part for smoothing the phase error, and according to the judgement made by the quality judgement part, takes in, for retention, a sign of an output signal of the phase error filter part every time the quality changes from good to bad, and when the quality is good, outputs the phase error, but when the quality is bad, outputs a given error value according to the retained sign for a given duration of time right after the quality is judged as being bad.

As described above, in the fortieth aspect, the quality of the incoming signal is judged according to the phase error after the phase error filter part. Therefore, it becomes possible to provide a clock recovery apparatus in which the data clock and the recovered clock signal coincide with each other, with accuracy, in both frequency and phase without being affected by any noise supposedly included in the incoming signal. Further, therein, the frequency of the recovered clock signal may not be erroneously shifted to a greater degree from that of the data clock. This is because, the duration of the quality being bad is limited to a given time.

According to a forty-first aspect, in the thirty-second aspect, the frequency error detection part includes a count part for counting the oscillation clock signals generated during a given time, and outputs a difference between a count value obtained by the count part and a given expected value as the frequency error.

As described above, in the forty-first aspect, the frequency error can be detected with high accuracy. Accordingly, a clock recovery apparatus can be provided, in which the data clock and the recovered clock signal coincide with each other, with accuracy, in both frequency and phase.

According to a forty-second aspect, in the thirty-second aspect, the sampling part includes an equalization part for equalizing the incoming signal sampled by the oscillation clock signal for output as the sampled value.

As described above, in the forty-second aspect, it becomes possible to provide a clock recovery apparatus which can be incorporated into a signal reproduction processing part in the signal reproduction apparatus applying PRML method.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram showing the structure of a reproduction signal processing part, in a signal reproduction apparatus, into which a clock recovery apparatus according to a first embodiment of the present invention is incorporated;

FIG. 2 is a block diagram showing the structure of a phase error detector in the clock recovery apparatus of the first embodiment;

FIG. 3 is a diagram showing a phase-comparing characteristic of the phase error detector in the clock recovery apparatus of the first embodiment;

FIG. 5 is a block diagram showing the structure of a phase-frequency error detection circuit in the clock recovery apparatus of the first embodiment;

FIG. 18 is a block diagram showing the structure of a reproduction signal processing part, in a signal reproduction apparatus, into which a clock recovery apparatus according to a sixth embodiment of the present invention is incorporated;

DESCRIPTION OF THE PREFERRED EMBODIMENTS

Figure 19:
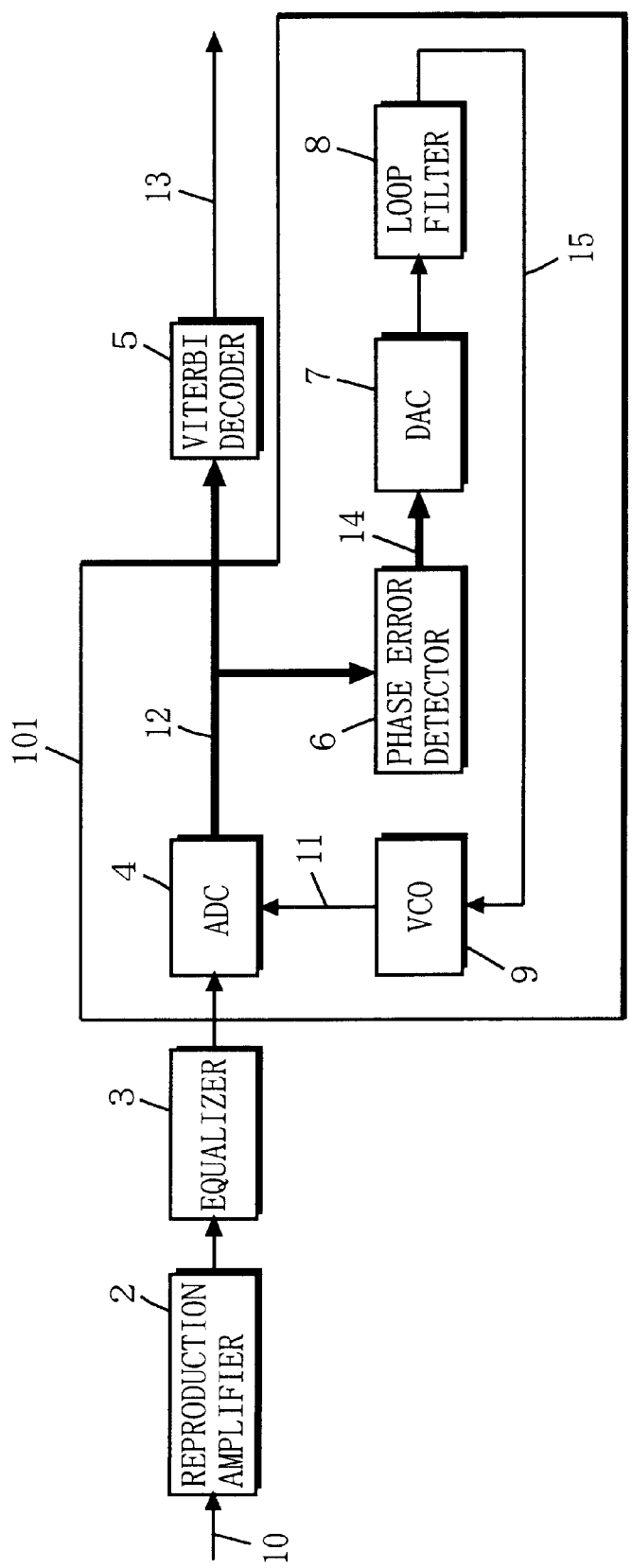
FIG. 19 is a block diagram showing a first structure of a reproduction signal processing part, in a signal reproduction apparatus, into which a first conventional clock recovery apparatus is incorporated.
Figure 20:
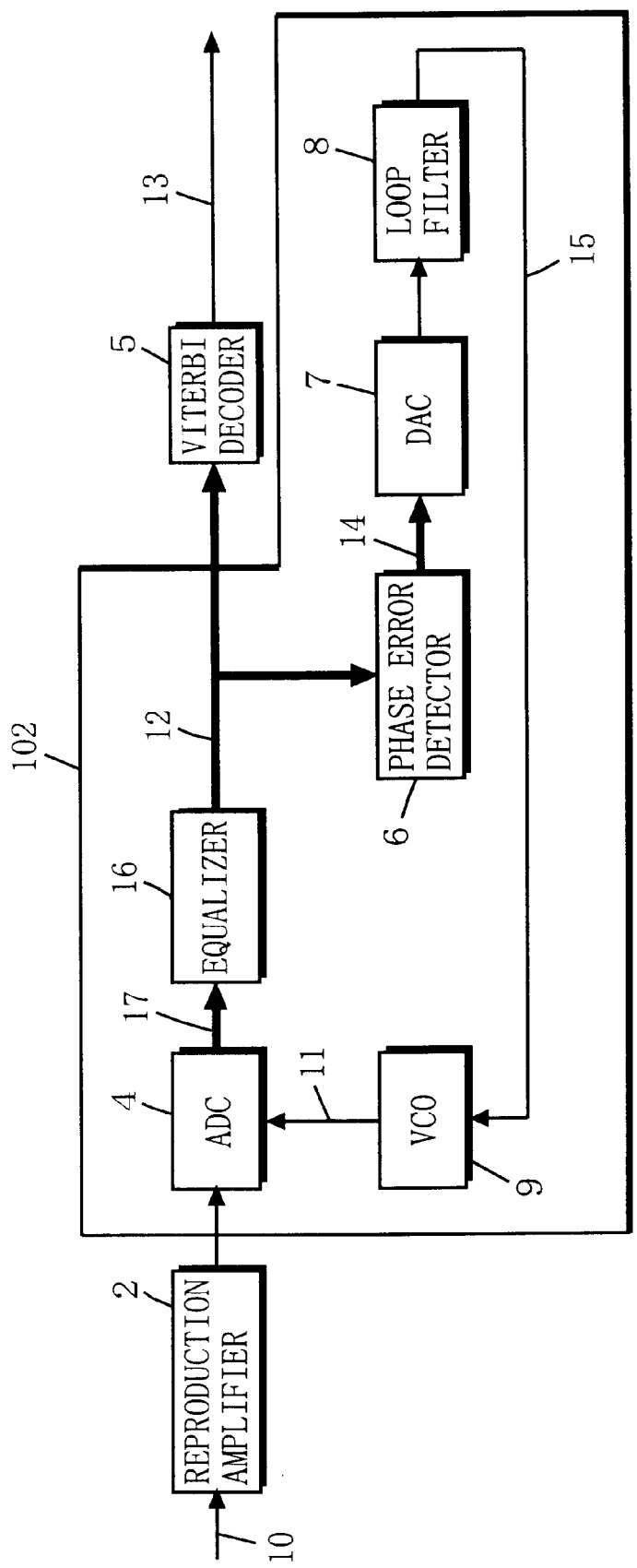
FIG. 20 is a block diagram showing a second structure of a reproduction signal processing part, in a signal reproduction apparatus, into which a second conventional clock recovery apparatus is incorporated.

Hereinafter, embodiments of the present invention are described by referring to accompanying drawings. In FIGS. 1 to 18, any identically functioning. constitute shares the same reference numeral. Note herein that, any constituent found in FIGS. 19 and 20 is also denoted by the same reference numeral. In block diagrams showing circuitry structures, a thinner arrow-headed signal line indicates an analog signal or a one-bit digital signal, while a thicker arrow-headed signal line indicates a digital signal including two or more bits.

(First Embodiment)

FIG. 1 is a block diagram showing the structure of a reproduction signal processing part, in a signal reproduction apparatus, into which a clock recovery apparatus according to a first embodiment of the present invention is incorporated. In the reproduction signal processing part in FIG. 1, a reference numeral 111 denotes the clock recovery apparatus of the first embodiment. The reproduction signal 10 reproduced from a recording medium is amplified in the reproduction amplifier 2. The signal is then sampled and quantized by the AD converter 4 with timing of the recovered clock signal 11, and converted to a digital reproduction signal 17. The digital reproduction signal 17 is, in digital processing, subjected to partial response equalization in the equalizer 16 to be the decoder input signal 12. Herein, the equalizer 16 performs equalization processing according to a partial response class 4 whose impulse response of the system composed of data recording to data reproduction is (1, 0, −1). According to Viterbi algorithm, the decoder input signal 12 is subjected to most likelihood decoding in the Viterbi decoder 5, and digital data recorded on the recording medium is outputted as the reproduction data 13.

The decoder input signal 12 is also forwarded to the phase error detector 6 and a signal quality judgement circuit 21. Being provided with the decoder input signal 12, the phase error decoder 6 detects a phase error between the data clock and the recovered clock signal 11 in a later-described manner. The detected phase error is then outputted as a phase error signal 25. On the other hand, the signal quality judgement circuit 21 judges signal quality of the provided decoder input signal 12 in a later-described manner, and the judged signal quality is outputted as a quality judgement signal 26. The phase error signal 25 and the quality judgement signal 26 are both forwarded to a phase-frequency error detection circuit 22. The phase-frequency error detection circuit 22 calculates, in a later-described manner, a phase-frequency error signal 27 from the phase error signal 25 and the quality judgement signal 26. The phase-frequency error signal 27 is provided to a loop filter 23. The loop filter 23 is structured by a constant multiplier 20 in which a response characteristic to the phase error is mainly determined, a constant multiplier 19 in which a response characteristic to the frequency error is mainly determined, an adder 30, a delay circuit 28, and an adder 29. Herein, the adder 30 and the delay circuit 28 structure an integrating circuit, in which an output signal from the constant multiplier 19, i.e., a phase-frequency error multiplication result 91 is integrated on a clock basis. An output signal from the loop filter 23, i.e., a filter output signal 18 is converted to an analog signal by a DA converter 24, and the analog signal is outputted as the oscillation control signal 15. The oscillation control signal 15 is forwarded to the VCO 9. The VCO 9 oscillates according to a frequency controlled by the oscillation control signal 15, and generates the recovered clock signal 11. Presumably, the larger the value of the oscillation control signal 15, the higher the oscillation frequency of the VCO 9. The recovered clock signal 11 is used as a sampling clock in the AD converter 4.

In the clock recovery apparatus 111, a PLL circuit is structured by a feed-back loop including the AD converter 4, the equalizer 16, the phase error detector 6, the signal quality judgement circuit 21, the phase-frequency error detection circuit 22, the loop filter 23, the DA converter 24, and the VCO 9. Next below, among the above constituents, the structure and the operation are described below for each of the phase error detector 6, the signal judgement circuit 21, and the phase-frequency error detection circuit 22. These constituents feature the first embodiment.

FIG. 2 is a block diagram showing the structure of the phase error detector 6. The phase error detector 6 in FIG. 2 is structured by a trinary judgement circuit 31, delay circuits 32 and 36, multipliers 33 and 34, and a subtractor 35. The trinary judgement circuit 31 compares the decoder input signal 12 with given threshold values, and outputs any one of 1, 0, and −1. The delay circuits 32 and 36 respectively delay an output from the trinary judgement circuit 31 and the decoder input signal 12 for a clock period. The multiplier 33 multiplies the decoder input signal 12 by an output from the delay circuit 32. The multiplier 34 multiplies an output from the delay circuit 36 by the output from the trinary judgement circuit 31. The subtractor 35 calculates a difference in output between the multiplier 34 and the multiplier 33. With such structure, being provided with the decoder input signal 12, the phase error detector 6 detects the phase error between the data clock and the recovered clock signal 11 for every clock of the recovered clock signal 11, and outputs the result obtained thereby as the phase error signal 25. More detailed operation of the phase error detector 6 is exemplarily found in Roy D. Cideciyan, et al., "A PRML system for digital magnetic recording", IEEE Journal on selected areas in communications, Vol. 10, No. 1 (January 1992). A phase-comparing characteristic between the data clock and the recovered clock signal 11 is shown in FIG. 3, where a lateral axis indicates the phase error therebetween and a longitudinal axis the value of the phase error signal 25.

Figure 4:
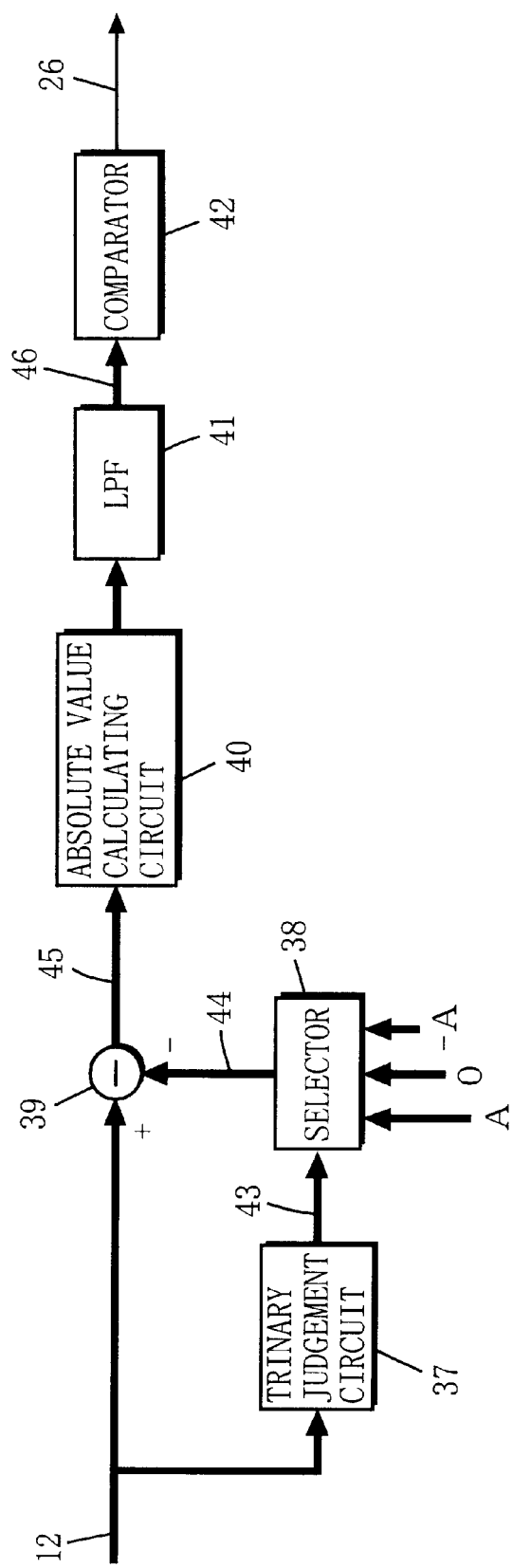
FIG. 4 is a block diagram showing the structure of a signal quality judgement circuit in the clock recovery apparatus of the first embodiment.

FIG. 4 is a block diagram showing the structure of the signal quality judgement circuit 21. In the signal quality judgement circuit in FIG. 4, the decoder input signal 12 is provided to both a trinary judgement circuit 37 and a subtractor 39. Since the decoder input signal 12 has been equalized according to the partial response class 4, the signal 12 takes any one of "A", "0", and "−A" when no noise or phase error is observed therein (where A is a constant indicating a given amplitude). In reality, however, the decoder input signal 12 cannot be free from noise and phase error. Accordingly, the value of the decoder input signal 12 is distributed over a range where those three values are included. In this manner, the trinary judgement circuit 37 selects a value "1" when the value of the decoder input signal 12 is larger than "A/2", a value "0" when the signal value is larger than "−A/2" and smaller than "A/2", and a value "−1" when the signal value is smaller than "−A/2", and the selected value is outputted as a temporary judgement signal 43. When the temporary judgement signal 43 indicates "1", "0", or "−1", a selector 38 selects the value "A", "0" or "−A", respectively, and outputs the selected value as a reference value signal 44. If the trinary judgement circuit 37 correctly performs the temporal judgement, the reference value signal 44 may be equal to a value obtained by removing, from the value of the decoder input signal 12, any noise or phase error between the data clock and the recovered clock signal 11. The subtractor 39 calculates a difference 45 in value between the decoder input signal 12 and the reference value signal 44. The difference 45 is changed into an absolute value thereof by an absolute value calculating circuit 40, and then the absolute value is smoothed by a Low Pass Filter (LPF) 41 to be an error signal 46. The error signal 46 indicates an average of the absolute value of the difference between an ideal value of the decoder input signal 12 and an actual value thereof. A comparator 42 compares the value of the error signal 46 with a given threshold value, and judges the signal quality of the decoder input signal 12. In detail, when the value of the error signal 46 is equal to or smaller than the threshold value, the comparator 42 outputs, as the quality judgement signal 26, a value "L" (Low Level) indicating the signal quality being "good". On the other hand, when the value of the error signal 46 is larger than the threshold value, a value "H" (High Level) indicating the signal quality being "bad" is outputted. Note that, in the signal quality judgement circuit in FIG. 4, the difference 45 is changed into the absolute value thereof in the absolute value calculating circuit 40. As an alternative thereto, the difference 45 may be changed into a square thereof.

FIG. 5 is a block diagram showing the structure of the phase-frequency error detection circuit 22. In the phase-frequency error detection circuit in FIG. 5, the phase error signal 25 is provided to both a sign retention circuit 48 and a selector 49. The quality judgement signal 26 is provided to both a rising edge detection circuit 47 and the selector 49. When a rising edge of the quality judgement signal 26 is detected, the rising edge detection circuit 47 outputs, as a quality change signal 50, a value "1", and when not detected, a value "0" is outputted. The quality change signal 50 is forwarded to the sign retention circuit 48. When the quality change signal 50 indicates "1", the sign retention circuit 48 takes in a sign of the phase error signal 25 for retention, and outputs the value thereof as a retained sign signal 51 to the selector 49. The selector 49 receives the quality judgement signal 26, the retained sign signal 51, the phase error signal 25, and given values "B" and "−B". The selector 49 selects, for output, the phase error signal 25 when the quality judgement signal 26 is in the L level, the value "B" when the quality judgement signal 26 is in the H level and the retained sign signal 51 is positive, and the value "−B" when the quality judgement signal 26 is in the H level and the retained sign signal 51 is negative.

Next, the operation of the clock recovery apparatus 111 of the first embodiment is described, focused on how the data clock and the recovered clock signal 11 differed in frequency coincide with each other in frequency, and become phase locked.

Figure 6:
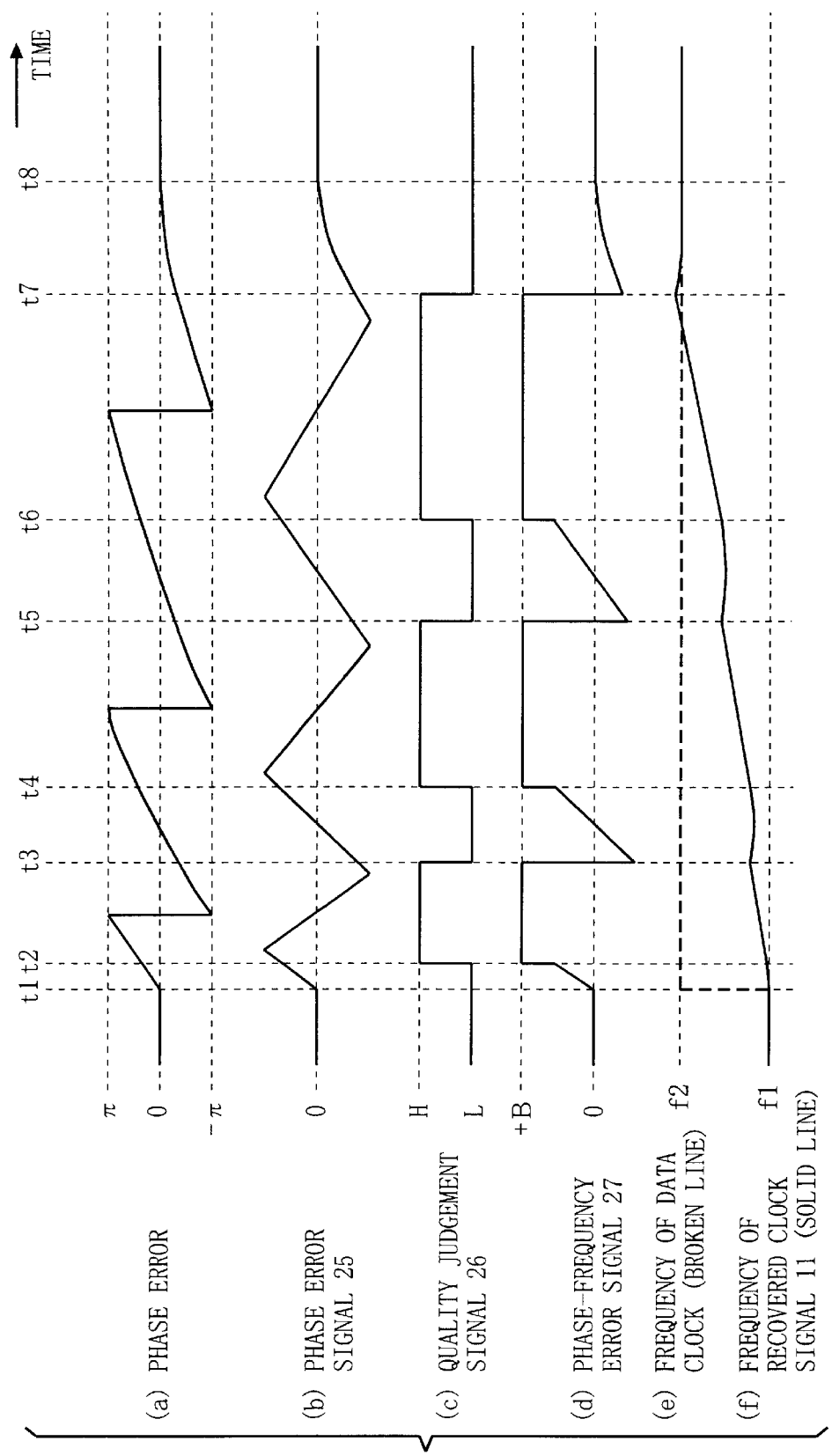
FIG. 6 is a signal waveform for illustrating the operation of the clock recovery apparatus of the first embodiment.

FIG. 6 is a signal waveform showing how the clock recovery apparatus 111 of the first embodiment is operated in a case where the frequency of the data clock is changed to be higher than that of the recovered clock signal 11. In FIG. 6, a signal a indicates the phase error between the data clock and the recovered clock signal 11 in a range between −π and π. Signals b, c, and d respectively indicate the phase error signal 25, the quality judgement signal 26, and the phase-frequency error signal 27. A signal e shown by a dashed line indicates the frequency of the data clock. A signal f shown by a solid line indicates the frequency of the recovered clock signal 11.

(Period 1) Before Time t1

Presumably, synchronization has been established in the PLL circuit, and the data clock and the reproduction clock signal 11 coincide with each other in both frequency and phase.

(Period 2) Between Time t1 and Time t2

Presumably, at Time t1, the frequency of the data clock is changed to be higher from f1 to f2, and consequently the synchronization established in the PLL circuit is lost. From Time t1 and onward, the frequency of the recovered clock signal 11 gets lower relative to that of the data clock, while the period of the recovered clock signal 11 gets longer relative to that of the data clock. As a result, the phase of the decoder input signal 12 sampled with timing of the recovered clock signal 11 is sequentially advanced on a clock basis. Accordingly, the phase error shifts to be positive from 0, and the value of the phase error signal 25 is responsively increased. Since the phase error observed before Time t2 is small, the quality judgement signal 26 is in the L level. Therefore, the phase-frequency error detection circuit 22 selects the phase error signal 25 as the phase-frequency error signal 27. In response thereto, the value of the phase-frequency error signal 27 is increased, and accordingly the frequency of the recovered clock signal 11 gets slightly higher.

(Period 3) Between Time t2 and t3

The value of the phase error signal 25 gets larger with increasing phase error, and accordingly the quality judgement signal 26 is changed to be in the H level at Time t2. The phase-frequency error detection circuit 22 takes a "positive" value into the sign retention circuit 48. The positive value is the sign of the phase error signal 25 at Time t2. Therefore, from Time t2 and onward, the value "B" is selected as the phase-frequency error signal 27. Thereafter, the phase-frequency error signal 27 remains in the value "B" until the phase error gets smaller again and the quality judgement signal 26 is changed to be in the L level at Time t3. As a result, the filter output signal 18 is integrated by going through the integrating circuit structured by the adder 30 and the delay circuit 28, and then increased in value, and accordingly the frequency of the recovered clock signal 11 gets higher.

(Period 4) Between Time t3 and Time t4

The phase error gets smaller again, and the quality judgement signal 26 is changed to be in the L level in a period between Time t3 and Time t4. In this period, the phase-frequency error detection circuit 22 selects the phase error signal 25 as the phase-frequency error signal 27. Since the integration result of the phase-frequency error signal 27 during this period is almost 0, a direct-current component of the filter output signal 18 shows little change. Accordingly, the frequency of the recovered clock signal 11 shows little change.

(Period 5) Between Time t4 and Time t5

The phase error gets larger again, and the quality judgement signal 26 is changed to be in the H level in a period between Time t4 and Time t5. Since the circuitry operation in this period is similar to that in the period between Time 2 and Time t3, the frequency of the recovered clock signal 11 gets still higher and closer to f2 being the frequency of the data clock. Herein, the frequency of the recovered clock signal 11 being closer to f2 makes the change in phase error more gradual.

(Period 6) Between Time t5 and Time t6

The circuitry operation in this period is similar to that in the period between Time t3 and Time t4. Therefore, the frequency of the recovered clock signal 11 shows little change.

(Period 7) Between Time t6 and Time t7

The circuitry operation in this period is similar to that in the period between Time t2 and Time t3. Therefore, the frequency of the recovered clock signal 11 gets still higher to be slightly higher than f2.

(Period 8) Between Time t7 and Time t8

The phase error again gets smaller, and the quality judgement signal 26 is changed to be in the L level at Time t7. Also at Time t7, the frequency of the recovered clock signal 11 almost coincides with f2. From Time t7 and onward, due to the pull-in operation of the PLL circuit, the frequency and the phase of the recovered clock signal 11 get closer to those of the data clock, respectively. In this manner, the data clock and the recovered clock signal 11 coincide with each other in frequency and phase at Time t8.

(Period 9) From Time t8 and onward

Synchronization in the PLL circuit is established again, and the data clock and the recovered clock signal 11 coincide with each other in frequency and phase.

Figure 7:
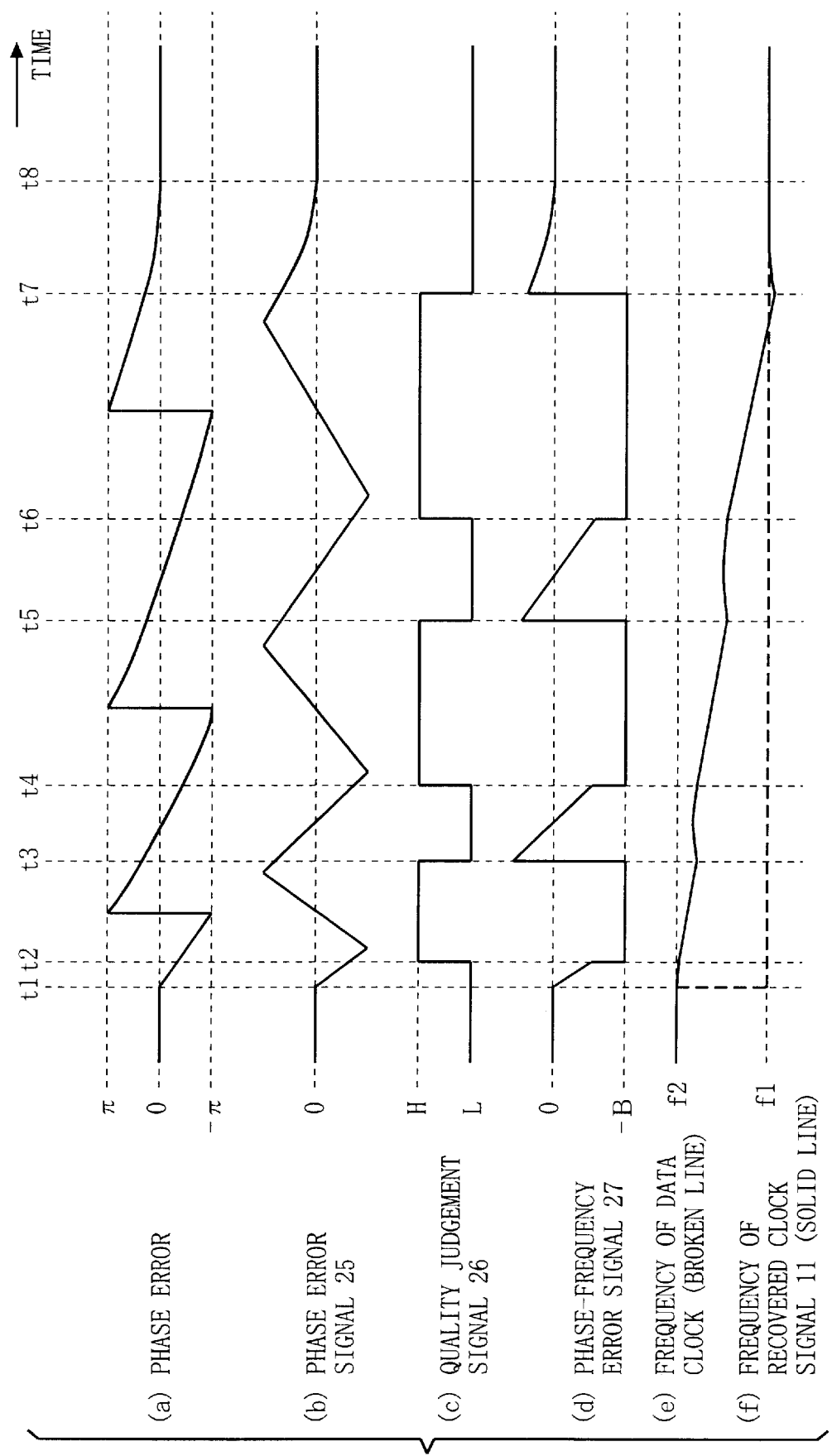
FIG. 7 is a signal waveform for illustrating the operation of the clock recovery apparatus of the first embodiment.

FIG. 7 is a signal waveform showing how the clock recovery apparatus 111 of the first embodiment operates in a case where the frequency of the data clock is changed to be lower than that of the recovered clock signal 11. The kind of signals shown in FIG. 7 are identical to the ones in FIG. 6.

(Period 1) Before Time t1

Presumably, synchronization has been established in the PLL circuit, and the data clock and the reproduction clock signal 11 coincide with each other in both frequency and phase.

(Period 2) Between Time t1 and Time t2

Presumably, at Time t1, the frequency of the data clock is changed to be lower from f2 to f1, and consequently the synchronization established in the PLL circuit is lost. From Time t1 and onward, the frequency of the recovered clock signal 11 gets higher relative to that of the data clock, while the period of the recovered clock signal 11 gets shorter relative to that of the data clock. As a result, the phase of the decoder input signal 12 sampled with timing of the recovered clock signal 11 is sequentially delayed on a clock basis. Accordingly, the phase error shifts to be negative from 0, and the value of the phase error signal 25 is responsively decreased. Since the phase error observed before Time t2 is small, the quality judgement signal 26 is in the L level. Therefore, the phase-frequency error detection circuit 22 selects the phase error signal 25 as the phase-frequency error signal 27. In response thereto, the value of the phase-frequency error signal 27 is decreased, and accordingly the frequency of the recovered clock signal 11 gets slightly lower.

(Period 3) Between Time t2 and t3

The value of the phase error signal 25 gets smaller with increasing phase error, and accordingly the quality judgement signal 26 is changed to be in the H level at Time t2. The phase-frequency error detection circuit 22 takes a "negative" value into the sign retention circuit 48. The negative value is the sign of the phase error signal 25 at Time t2. Therefore, from Time t2 and onward, the value "−B" is selected as the phase-frequency error signal 27. Thereafter, the phase-frequency error signal 27 remains in the value "−B" until the phase error gets smaller again and the quality judgement signal 26 is changed to be in the L level at Time t3. As a result, the filter output signal 18 is integrated by going through the integrating circuit structured by the adder 30 and the delay circuit 28, and then decreased in value, and accordingly the frequency of the recovered clock signal 11 gets lower.

(Period 4) Between Time t3 and Time t4

The phase error gets smaller again, and the quality judgement signal 26 is changed to be in the L level in the period between Time t3 and Time t4. In this period, the phase-frequency error detection circuit 22 selects the phase error signal 25 as the phase-frequency error signal 27. Since the phase-frequency error signal 27 becomes almost 0 after integration in this period, the direct-current component of the filter output signal 18 shows little change. Accordingly, the frequency of the recovered clock signal 11 shows little change.

(Period 5) Between Time t4 and Time t5

The phase error gets larger again, and the quality judgement signal 26 is changed to be in the H level in the period between Time t4 and Time t5. Since the circuitry operation in this period is similar to that in the period between Time t2 and Time t3, the frequency of the recovered clock signal 11 gets still lower and closer to f1 being the frequency of the data clock. Herein, the frequency of the recovered clock signal 11 being closer to f1 makes the change in phase error more gradual.

(Period 6) Between Time t5 and Time t6

The circuitry operation in this period is similar to that in the period between Time t3 and Time t4. Therefore, the frequency of the recovered clock signal 11 shows little change.

(Period 7) Between Time t6 and Time t7

The circuitry operation in this period is similar to that in the period between Time t2 and Time t3. Therefore, the frequency of the recovered clock signal 11 gets still lower to be slightly lower than f1.

(Period 8) Between Time t7 and Time t8

The phase error again gets smaller, and the quality judgement signal 26 is changed to be in the L level at Time t7. Also at Time t7, the frequency of the recovered clock signal 11 almost coincides with f1. From Time t7 and onward, due to the pull-in operation of the PLL circuit, the frequency and the phase of the recovered clock signal 11 get closer to those of the data clock, respectively. In this manner, the data clock and the recovered clock signal 11 coincide with each other in frequency and phase at Time t8.

(Period 9) From Time t8 and onward

Synchronization in the PLL circuit is established again, and the data clock and the recovered clock signal 11 coincide with each other in frequency and phase.

As is described in the foregoing, according to the first embodiment, the phase-frequency error detection circuit 22 retains the sign of the phase error signal 25 as the retained sign signal 51. Herein, the sign of the signal 25 is the one obtained when the level of the quality judgement signal 26 is changed from L to H. For output as the phase-frequency error signal 27, the phase error signal 25 is selected when the quality judgement signal 26 being in the L level. Similarly, the value "B" is selected when the quality judgement signal 26 is in the H level and the retained sign signal 51 is positive, and the value "−B" when the signal 26 is in the H level and the signal 51 is negative. Further, with the oscillation control signal 15 based on the phase-frequency error signal 27, the oscillation frequency of the recovered clock signal 11 generated by the VCO 9 can be controlled. With such structure, a clock recovery apparatus with a wider pull-in range is implemented, in which the data clock and the recovered clock signal 11 differing in frequency coincide with each other therein. Still further, the PLL circuit can be so structured that the delay observed in the feed-back loop can be lengthened. Therefore, the digital equalizer can be employed therein, and accordingly the equalization processing therein can be highly accurate, adjustment-free, or carried out in an LSI chip. Still further, with the wider pull-in range, it becomes possible to provide a clock recovery apparatus which can supply stable recovered clock signals even to a magnetic tape drive, for example, where frequency variation of the reproduced data is wide.

(Modified Example of First Embodiment)

Figure 8:
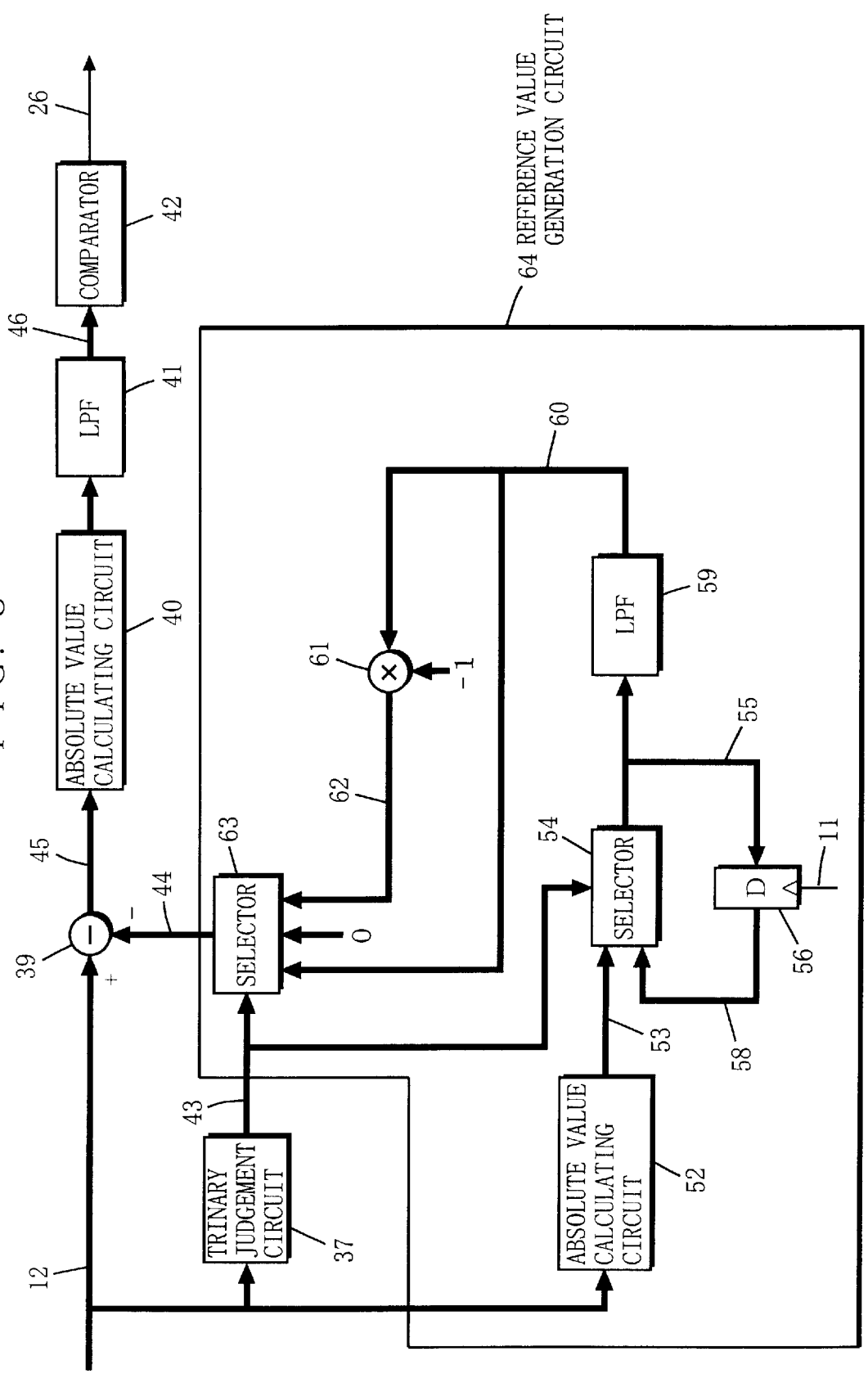
FIG. 8 is a block diagram showing the structure of a second signal quality judgement circuit in the clock recovery apparatus of the first embodiment.

In the first embodiment, the structure shown in FIG. 8 may be an structural alternative to the signal quality judgement circuit 21 shown in FIG. 4. The signal quality judgement circuit in FIG. 8 is differed from that in FIG. 4 on a respect that the decoder input signal 12 is provided to a reference value generation circuit 64 to generate the reference value signal 44. In the signal quality judgement circuit shown in FIG. 4, the decoder input signal 12 is provided to the selector 38 to generate the reference value signal 44.

In the signal quality judgement circuit in FIG. 8, the decoder input signal 12 is provided to the subtractor 39, the trinary judgement circuit 37, and the reference value generation circuit 64. Like the trinary judgement circuit in FIG. 4, the trinary judgement circuit 37 outputs, according to the decoder input signal 12, "1", "0", or "−1" as the temporary judgement signal 43. Being provided with the decoder input signal 12 and the temporary judgement signal 43, the reference value generation circuit 64 calculates the reference value signal 44 in the following manner. First, an absolute value calculating circuit 52 calculates an absolute value of the decoder input signal 12, and outputs the absolute value as an absolute value signal 53. A delay circuit 56 delays an output signal from the selector 54, i.e., a selected output signal 55 for a period of the recovered clock signal 11, and outputs a delayed selection output signal 58. A selector 54 selects, for output, the absolute value signal 53 when the temporary judgement signal 43 indicates "1" or "−1". On the other hand, the delayed selection output signal 58 is outputted when the temporary judgement signal 43 indicates "0". The selected output signal 55 is smoothed in a low pass filter 59 to be a positive reference value signal 60. The positive reference value signal 60 is equivalent to a smoothed absolute value of an amplitude of the decoder input signal 12 judged "1" or "−1". A selector 63 is provided with the positive reference value signal 60, the value "0", and a negative reference value signal 62. The negative reference value signal 62 is a signal obtained by inverting a sign of the positive reference value signal 60 by a sign inversion circuit 61. The selector 63 selects, respectively, the positive reference value signal 60, the value "0", or the negative reference value signal 62 when the temporary judgement signal 43 indicates "1", "0", or "−1", and outputs the selected result as the reference value signal 44.

According to the signal quality judgement circuit in FIG. 8, the following effects are achieved. Exemplarily in a magnetic tape drive such as VCR, if a reproducing head crosses over recording tracks to reproduce data as is done in search play-back or still play-back, for example, the amplitude of the decoder input signal 12 varies in a greater degree with the passage of time. In the signal quality judgement circuit in FIG. 8, however, even if the amplitude of the decoder input signal 12 varies in a greater degree, with the passage of time, the signal quality can be accurately judged in response to the variation. This is because, therein, the reference value signal 60 which varies in response to the decoder input signal 12 is first calculated, and then the reference value signal 44 is generated according thereto. Note that, as an alternative to the absolute value calculating circuit 52, a circuit for calculating a square may be used.

Figure 9:
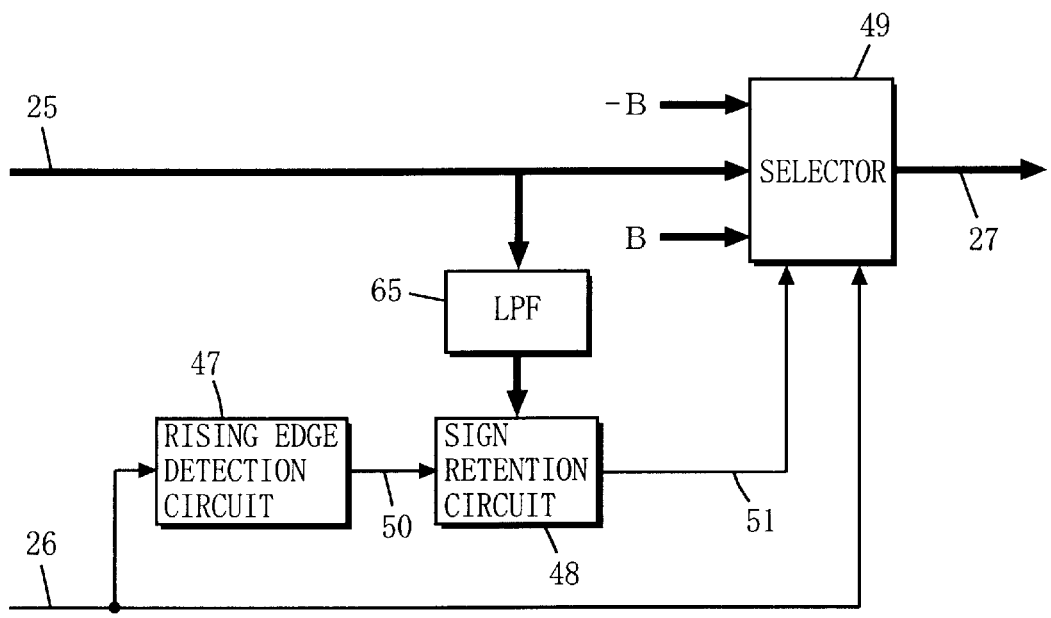
FIG. 9 is a block diagram showing the structure of a second phase-frequency error detection circuit in the clock recovery apparatus of the first embodiment.

Next, in the first embodiment, the structure shown in FIG. 9 may be an structural alternative to the phase-frequency error detection circuit 22 shown in FIG. 5. The phase-frequency error detection circuit in FIG. 9 is differed from that in FIG. 5 on a respect that the phase error signal 25 is provided to the sign retention circuit 48 via a low pass filter 65. In the phase-frequency error detection circuit in FIG. 5, the phase error signal 25 is directly provided to the sign retention circuit 48.

In the phase-frequency error detection circuit in FIG. 5, the sign retention circuit 48 takes in the sign of the phase error signal 25 when the quality change signal 50 indicates "1", and outputs the sign as the retained sign signal 51. If this is the case, however, the sign retention circuit 48 may fail to retain the correct sign, and accordingly it may take longer for the PLL circuit to perform the pull-in operation. According to the phase-frequency error detection circuit shown in FIG. 9, the phase error signal 25 is provided to the sign retention circuit 48 via the low pass filter 65. Therefore, the sign retention circuit 48 is less susceptible to any noise supposedly included in the phase error signal 25, and accordingly the PLL circuit can perform the pull-in operation with more reliability in a shorter time.

Figure 10:
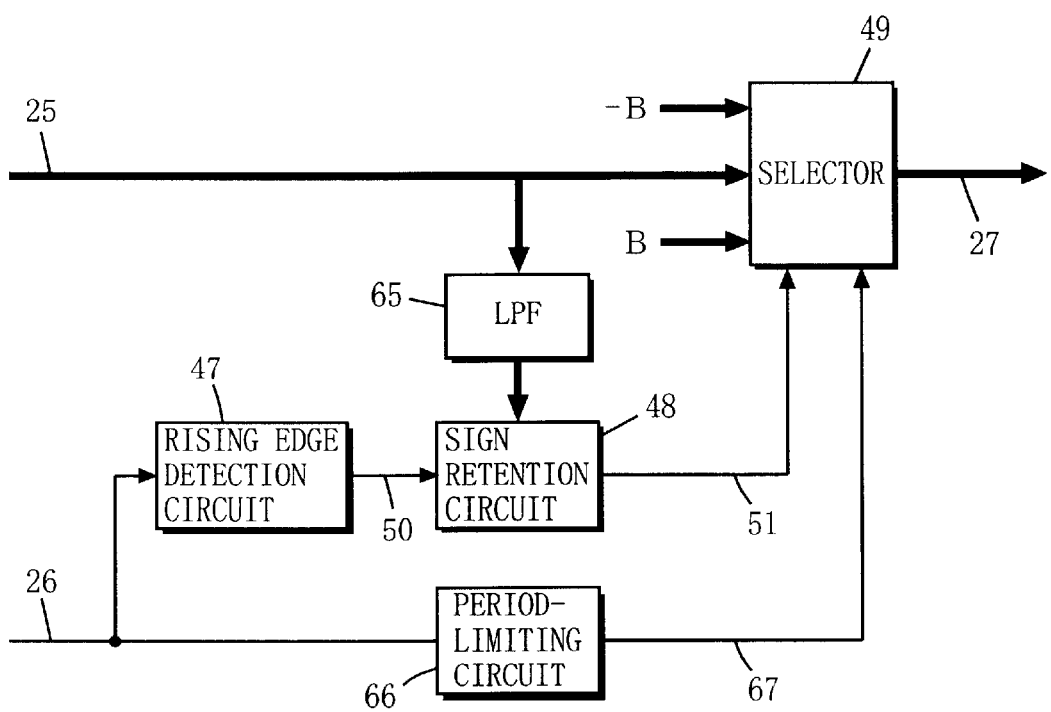
FIG. 10 is a block diagram showing the structure of a third phase-frequency error detection circuit in the clock recovery apparatus of the first embodiment.
Figure 11:
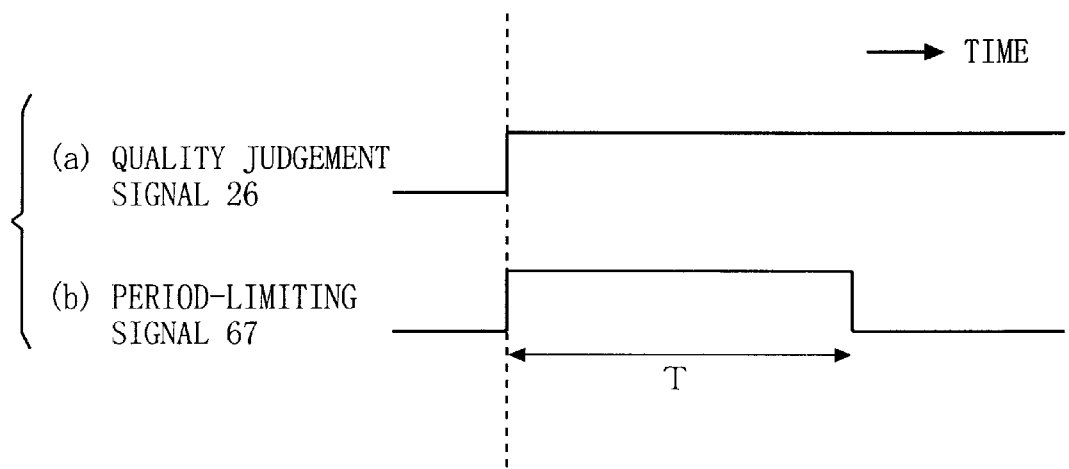
FIG. 11 is a signal waveform for illustrating the operation of the third phase-frequency error detection circuit in the clock recovery apparatus of the first embodiment.

Further, the structure shown in FIG. 10 may be an another structural alternative to the phase-frequency error detection circuit 22. The phase-frequency error detection circuit in FIG. 10 is different from that in FIG. 9 on two respects: a period-limiting circuit 66 is further provided; and the selector 49 is controlled by an output signal therefrom, i.e., a period-limiting signal 67. In the phase-frequency error detection circuit in FIG. 9, the selector 49 is controlled by the quality judgement signal 26. As is shown in a signal waveform in FIG. 11, when the quality judgement signal 26 is in the H level for a duration of time longer than a given time T, the period-limiting circuit 66 outputs the period-limiting signal 67 in which the duration is limited to time T. Herein, the time T is a predetermined length of time.

According to the phase-frequency error detection circuit in FIG. 10, the following effects are achieved. In the signal quality judgement circuit 21, the signal quality of the signal quality judgement signal 26 is judged as being "bad" and then is changed to be in the H level when the phase error between the data clock and the recovered clock signal 11 is large. The increased signal noise due to temporal tracking error may cause the same. When signal noise is increased due to temporal tracking error, the quality judgement signal 26 remains in the H level until tracking is put back into a normal state. If this is the case, in the phase-frequency error detection circuit in FIG. 9, the selector 49 keeps selecting the value "B" or "−B" for a long time. Therefore, the frequency of the recovered clock signal 11 may be shifted to a greater degree from that of the data clock in some cases. In the phase-frequency error detection circuit in FIG. 10, on the other hand, the frequency of the recovered clock signal 11 may not be erroneously shifted to a greater degree from that of the data clock. This is because, the duration of the period-limiting signal 67 to be in the H level is limited to Time T.

When the recovered clock signal 11 is differed in frequency from the data clock with no tracking error, as shown in the signal waveforms in FIGS. 6 and 7, the duration of the quality judgement signal 26 to be in the H level is relatively short. Accordingly, by setting Time T to be longer than the duration, the period-limiting signal 67 can be changed with the same timing as the quality judgement signal 26. In this manner, the period-limiting circuit 66 does not affect the pull-in operation of the PLL circuit, and accordingly the recovered clock signal 11 generated by the clock recovery apparatus of the first embodiment including the phase-frequency error detection circuit in FIG. 10 can coincide with the data clock in frequency and phase.

(Second Embodiment)

Figure 12:
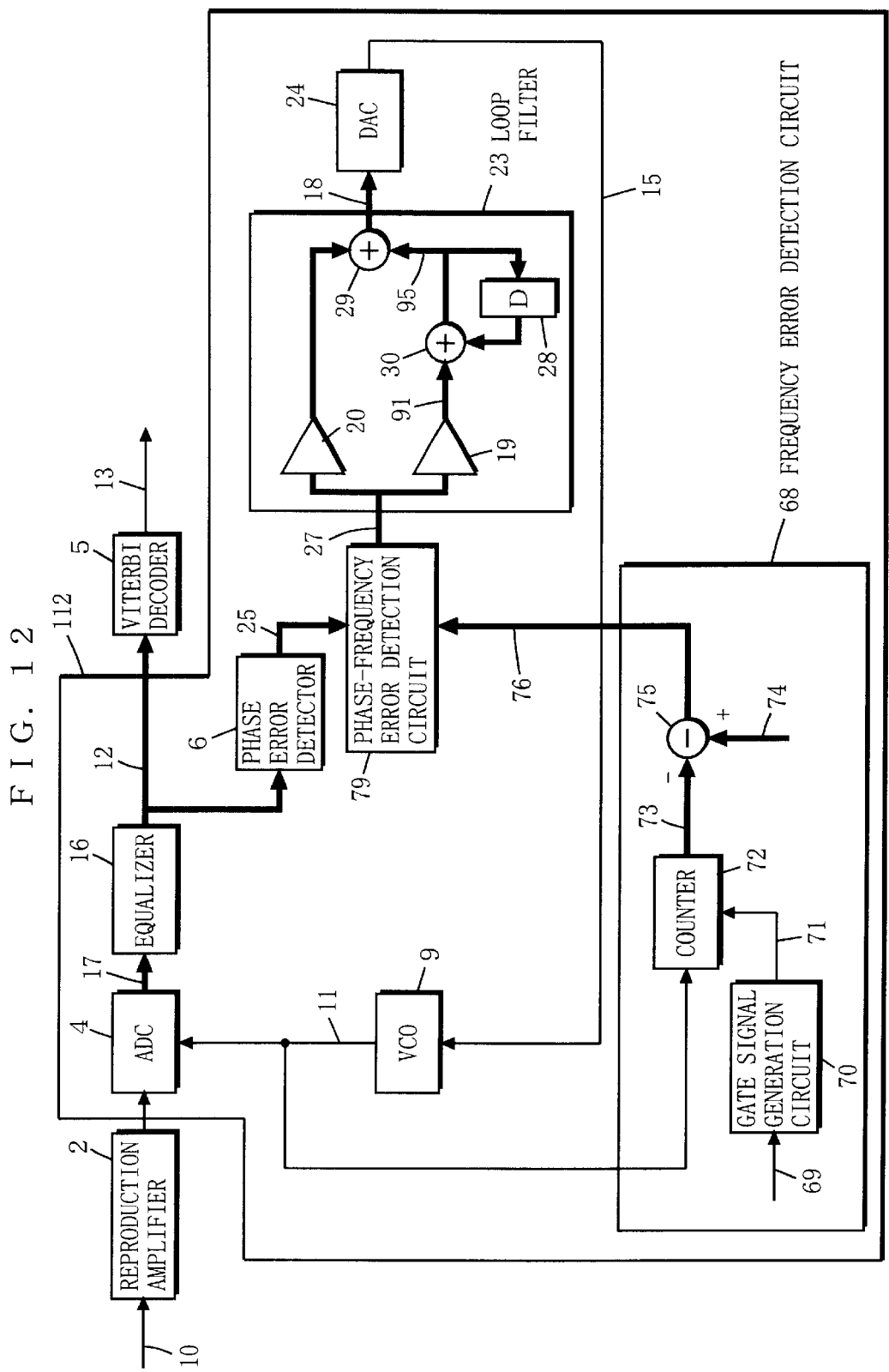
FIG. 12 is a block diagram showing the structure of a reproduction signal processing part, in the signal reproduction apparatus, into which a clock recovery apparatus according to a second embodiment of the present invention is incorporated.

FIG. 12 is a block diagram showing the structure of a reproduction signal processing part, in a signal reproduction apparatus, into which a clock recovery apparatus according to a second embodiment of the present invention is incorporated. In the reproduction signal processing part shown in FIG. 12, a reference numeral 112 denotes the clock recovery apparatus of the second embodiment. The clock recovery apparatus 112 in FIG. 12 is different from the clock recovery apparatus 111 in FIG. 1 on two respects: a frequency error detection circuit 68 for detecting a frequency error signal 76 is provided; and the phase-frequency error signal 27 is generated by a differently-structured phase-frequency error detection circuit 79. These differences and effects of the second embodiment are described next below.

In the clock recovery apparatus 112 in FIG. 12, the frequency error detection circuit 68 is structured by a gate signal generation circuit 70, a counter 72, and a subtractor 75. The gate signal generation circuit 70 is provided with a reference clock signal 69 whose frequency is known. Based on the reference clock signal 69, the gate signal generation circuit 70 generates a gate signal 71 having a given period. The counter 72 is provided with the gate signal 71 and the recovered clock signal 11. The counter 72 counts clock pulses of the recovered clock signal 11 generated during the period of the gate signal 71, and outputs the number as a count value 73. Since the period of the gate signal 71 is constant, the count value 73 is proportionate to the frequency of the recovered clock signal 11. The subtractor 75 subtracts the count value 73 from a reference count value 74, and outputs the result as a frequency error signal 76. Herein, the reference count value 74 is an expected value of the count value 73 obtained beforehand from the frequency of the data clock and the period of the gate signal 71. The frequency error signal 76 becomes a value proportionate to a difference in frequency between the data clock and the recovered clock signal 11. The frequency error signal 76 is provided to the phase-frequency error detection circuit 79.

Figure 13:
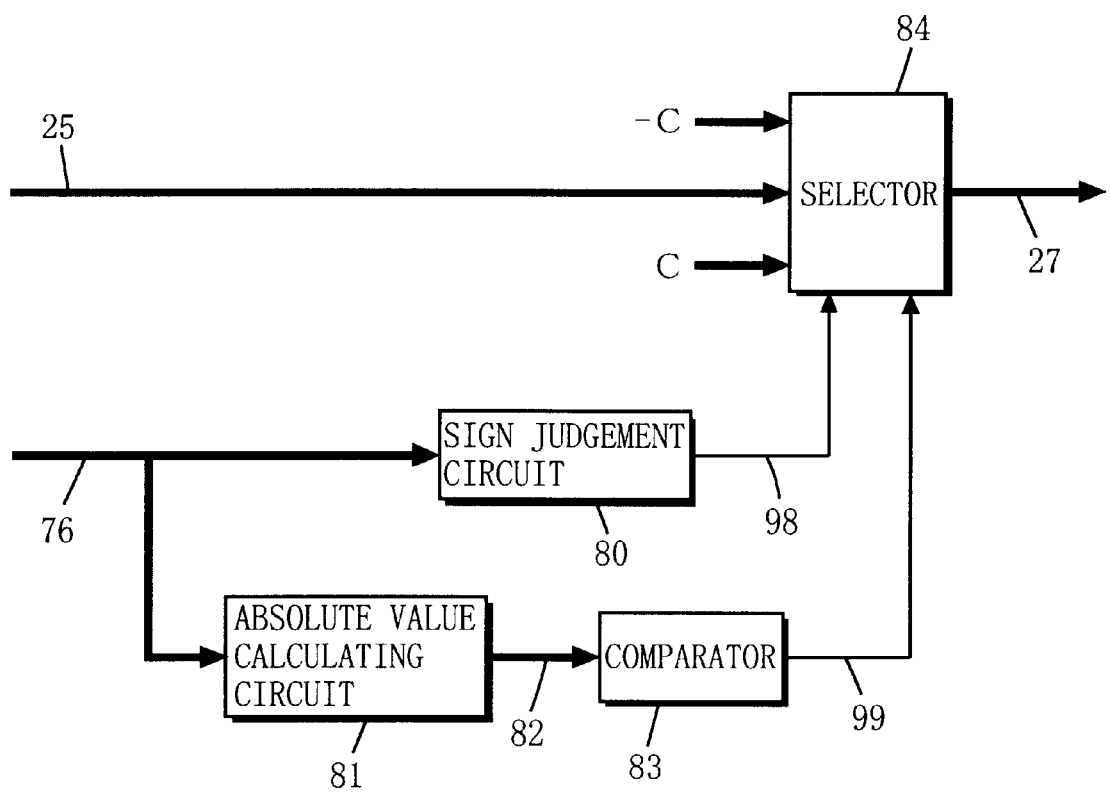
FIG. 13 is a block diagram showing the structure of a phase-frequency error detection circuit in the clock recovery apparatus of the second embodiment.

FIG. 13 is a block diagram showing the structure of the phase-frequency error detection circuit 79. A sign judgement circuit 80 receives the frequency error signal 76, and then outputs a sign thereof as a frequency error sign signal 98. An absolute value calculating circuit 81 outputs an absolute value of the frequency error signal 76 as an absolute value signal 82. A comparator 83 compares the value of the absolute value signal 82 and a given threshold value Δf, and outputs, as a frequency error judgement signal 99, a value "0" when the value of the absolute value signal 82 is Δf or smaller, and a value "1" when the value of the signal 82 is larger than Δf. The frequency error sign signal 98 and the frequency error judgement signal 99 are both provided to the selector 84 together with the phase error signal 25. According to the provided frequency error sign signal 98 and the frequency error judgement signal 99, the selector 84 selects any one of the phase error signal 25, a given value "C", or a given value "−C", and outputs the selected result as the phase-frequency error signal 27. In detail, the selector 84 selects, for output as the phase-frequency error signal 27, the phase error signal 25 when the frequency error judgement signal 99 indicates "0", the value "C" when the frequency error judgement signal 99 indicates "1" and the frequency error sign signal 98 is positive, and the value "−C" when the frequency error judgement signal 99 indicates "1" and the frequency error sign signal 98 is negative.

With such structure, in the second embodiment, when the difference in frequency between the data clock and the recovered clock signal 11 is larger than Δf, either the value "C" or "−C" depending on the frequency error sign signal 98 is provided to the loop filter 23 as the phase-frequency error signal 27. In this manner, the filter output signal 18 being the output signal from the loop filter is monotonically increased or decreased in value due to the operation of the integrating circuit in the loop filter 23, and responding thereto, the oscillation signal 15 is monotonically increased or decreased in value. Since such oscillation signal 15 controls the VCO 9, the frequency of the recovered signal 11 is monotonically increased or decreased. Accordingly, in due time, the difference in frequency between the data clock and the recovered clock signal 11 becomes equal to or less than Δf. With the difference in frequency therebetween being not more than Δf, the phase-frequency error detection circuit 79 selects the phase error signal 25, instead of the value "C" or "−C", for output as the phase-frequency error signal 27. By setting Δf in a proper value in advance, the data clock and recovered clock signal 11 coincide with each other in both frequency and phase by the pull-in operation of the PLL circuit.

As described in the foregoing, according to the second embodiment, the phase-frequency error detection circuit 79 selects, as the phase-frequency error signal 27, the phase error signal 25 when the frequency error judgement signal 99 indicates "0", and a given value corresponding to the frequency error sign signal 98 when the frequency error judgement signal 99 indicates "1". Further, according to the oscillation signal 15 which is based on the selected phase-frequency error signal 27, the oscillation frequency of the recovered clock signal 11 generated by the VCO 9 is controlled. With such structure, a clock recovery apparatus with a wide pull-in range can be implemented, in which the data clock and the recovered clock signal 11 greatly differ in frequency coincide with each other in frequency and phase. In the first embodiment, when the data clock and the recovered clock signal 11 are greatly different in frequency, the PLL circuit may not properly perform the pull-in operation. On the other hand, in the second embodiment, the PLL circuit accurately performs the pull-in operation even if the data clock and the recovered clock signal 11 are greatly different in frequency. This is because, the difference in frequency is detected based on the reference clock signal 69. In this manner, the pull-in range in the clock recovery apparatus of the second embodiment can be wider than that of the first embodiment. As already described in the first embodiment, a clock recovery apparatus with a wider pull-in range effectuates equalization processing with high accuracy, no adjustment, and only in an LSI. Further, the clock recovery apparatus can be employed in a magnetic tape drive where frequency variation of the reproduced data is wide. According to the second embodiment, such effects are more apparent.

(Third Embodiment)

Figure 14:
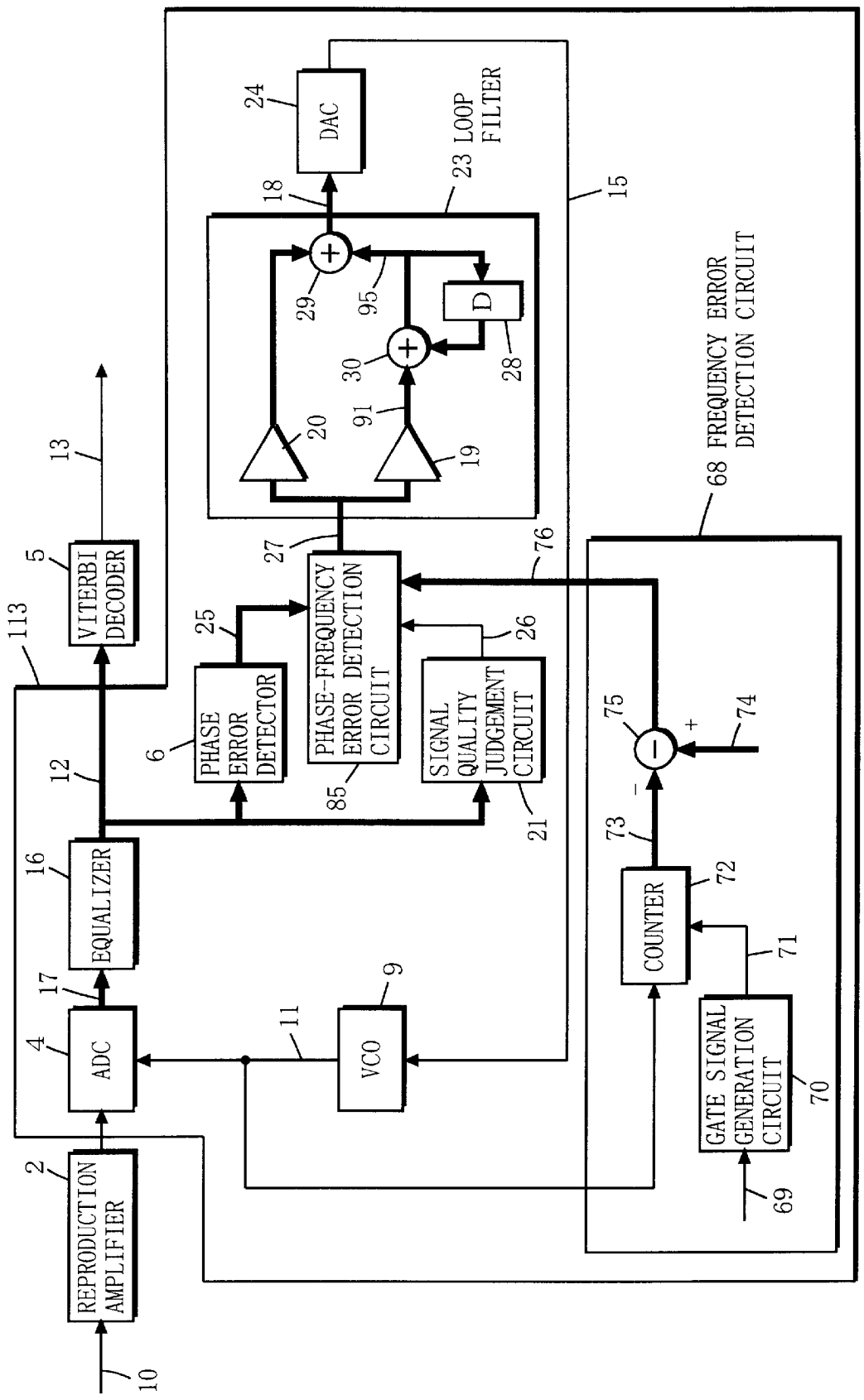
FIG. 14 is a block diagram showing the structure of a reproduction signal processing part, in a signal reproduction apparatus, into which a clock recovery apparatus according to a third embodiment of the present invention is incorporated.

FIG. 14 is a block diagram showing the structure of a reproduction signal processing part, in a signal reproduction apparatus, into which a clock recovery apparatus according to a third embodiment of the present invention is incorporated. In the reproduction signal processing part in FIG. 14, a reference numeral 113 denotes the clock recovery apparatus of the third embodiment. The clock recovery apparatus 113 in FIG. 14 bears both of the characteristics of the clock recovery apparatus 111 and 112 in the first and second embodiments. In the first embodiment, the phase-frequency error detection circuit 22 generates the phase-frequency error signal 27 by using the phase error signal 25 and the quality judgement signal 26. On the other hand, in the third embodiment, a phase-frequency error detection circuit 85 generates the phase-frequency error signal 27 by using the frequency error signal 76 together with the phase-frequency error signal 25 and the quality judgement signal 26. Such difference and effects of the third embodiment are described next below.

Figure 15:
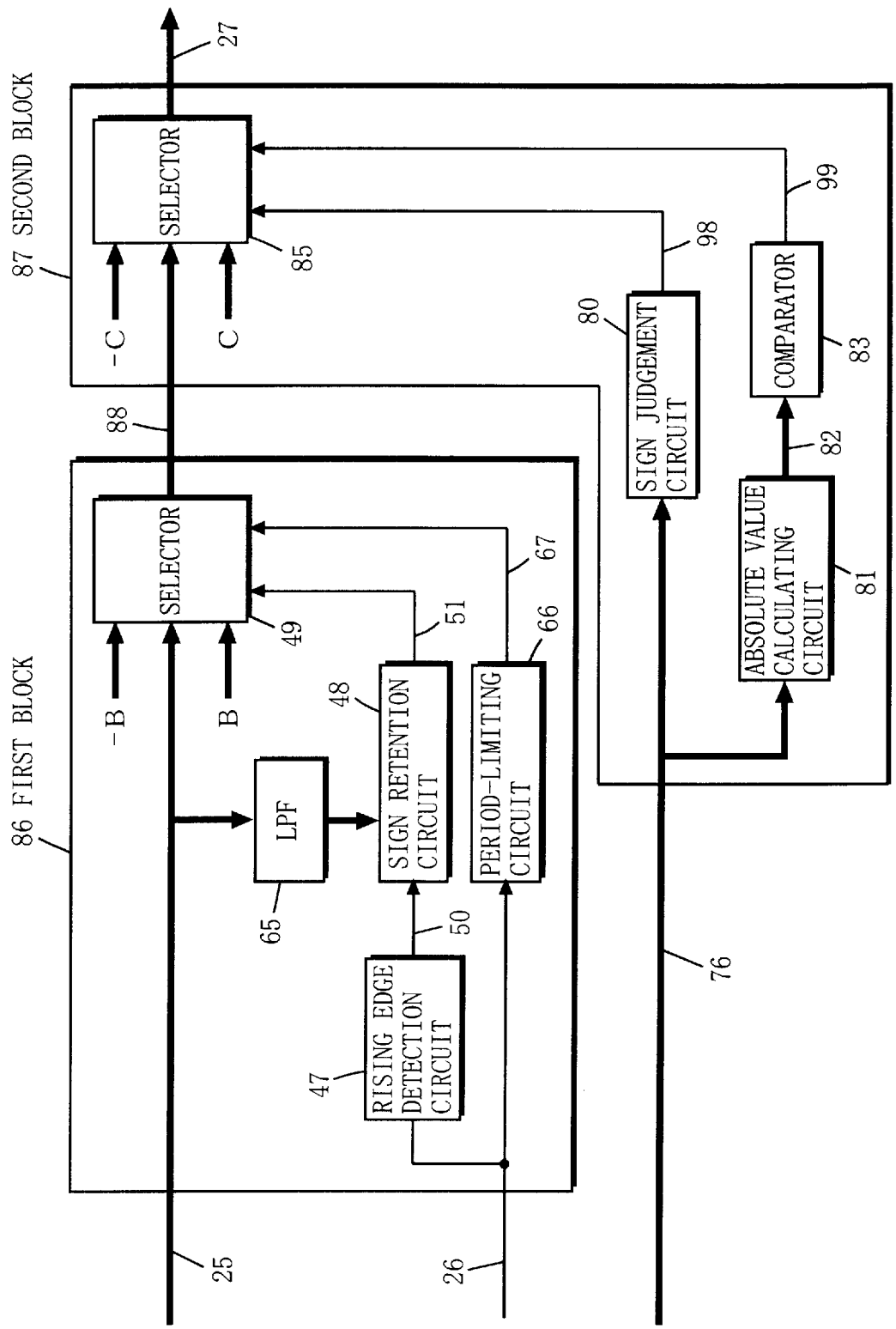
FIG. 15 is a block diagram showing the structure of a phase-frequency error detection circuit in the clock recovery apparatus of the third embodiment.

In the clock recovery apparatus 113 in FIG. 14, all of the AD converter 4, the equalizer 16, the phase error detector 6, the signal quality judgement circuit 21, the loop filter 23, the DA converter 24, and the VCO 9 operate in a similar manner to the ones in the first embodiment, and the frequency error detection circuit 68 operates in a similar manner to that in the second embodiment. FIG. 15 is a block diagram showing the structure of the phase-frequency error detection circuit 85, which is the characteristic of this embodiment. The phase-frequency error detection circuit in FIG. 15 is structured by a first block 86 and a second block 87. The first block 86 is structured and operated similarly to the phase-frequency error detection circuit 22 in the first embodiment in FIG. 10. The second block 87 is structured and operated similarly to the phase-frequency error detection circuit 79 in the second embodiment in FIG. 13.

With such structure, when the difference in frequency between the data clock and the recovered clock signal 11 is larger than Δf, the clock recovery apparatus in this embodiment operates similarly to the clock recovery apparatus 112 in the second embodiment in FIG. 12. When the difference is smaller than Δf, the clock recovery apparatus in this embodiment operates similarly to the clock recovery apparatus 111 in the first embodiment. Thereby, when the difference is larger than Δf, with the operation similar to the clock recovery apparatus 112 in the second embodiment, the difference is decreased to be Δf or smaller. Thereafter, with the operation similar to the clock recovery apparatus 111 in the first embodiment, the data clock and the recovered clock signal 11 coincide with each other in both frequency and phase.

The effects in the third embodiment are described next below. In the first embodiment, the PLL circuit may not properly perform the pull-in operation if the difference in frequency between the data clock and the recovered clock signal 11 is considerably large. On the other hand, in the third embodiment, even if the difference in frequency between the data clock and the recovered clock signal 11 is considerably large, the PLL circuit accurately performs the pull-in operation. This is because, the difference in frequency is detected based on the reference clock signal 69 in a similar manner to the second embodiment. Further, in the second embodiment, the PLL circuit starts performing the pull-in operation in a normal manner after the difference in frequency between the data clock and the recovered clock signal 11 being Δf or smaller. Therefore, it is required to set Δf small enough to have the PLL circuit properly perform the pull-in operation, and to improve the accuracy of the frequency of the reference clock signal 69 and the reference count value 74. The clock recovery apparatus in the third embodiment, on the other hand, operates in a similar manner to the first embodiment after the difference in frequency between the data clock and the recovered clock signal 11 becoming Δf or smaller. Therefore, the value of Δf can be relatively larger therein. In this manner, there is no more need to improve the accuracy of the frequency of the reference clock signal 69 and the reference count value 74, and accordingly circuitry implementation becomes easier.

Note that, in the above, the first block 86 in FIG. 15 is supposedly structured similar to the phase-frequency error detection circuit in FIG. 10. Alternatively, the first block 86 may be structured similar to the phase-frequency error detection circuit in FIG. 5 or 9. Further, the signal quality judgement circuit 21 may be structured as shown in FIG. 4 or FIG. 8. For the absolute value calculating circuit 40 in FIG. 4 or the absolute value calculating circuit 52 in FIG. 8, a circuit for calculating a square may be alternatively used.

(Fourth Embodiment)

Figure 16:
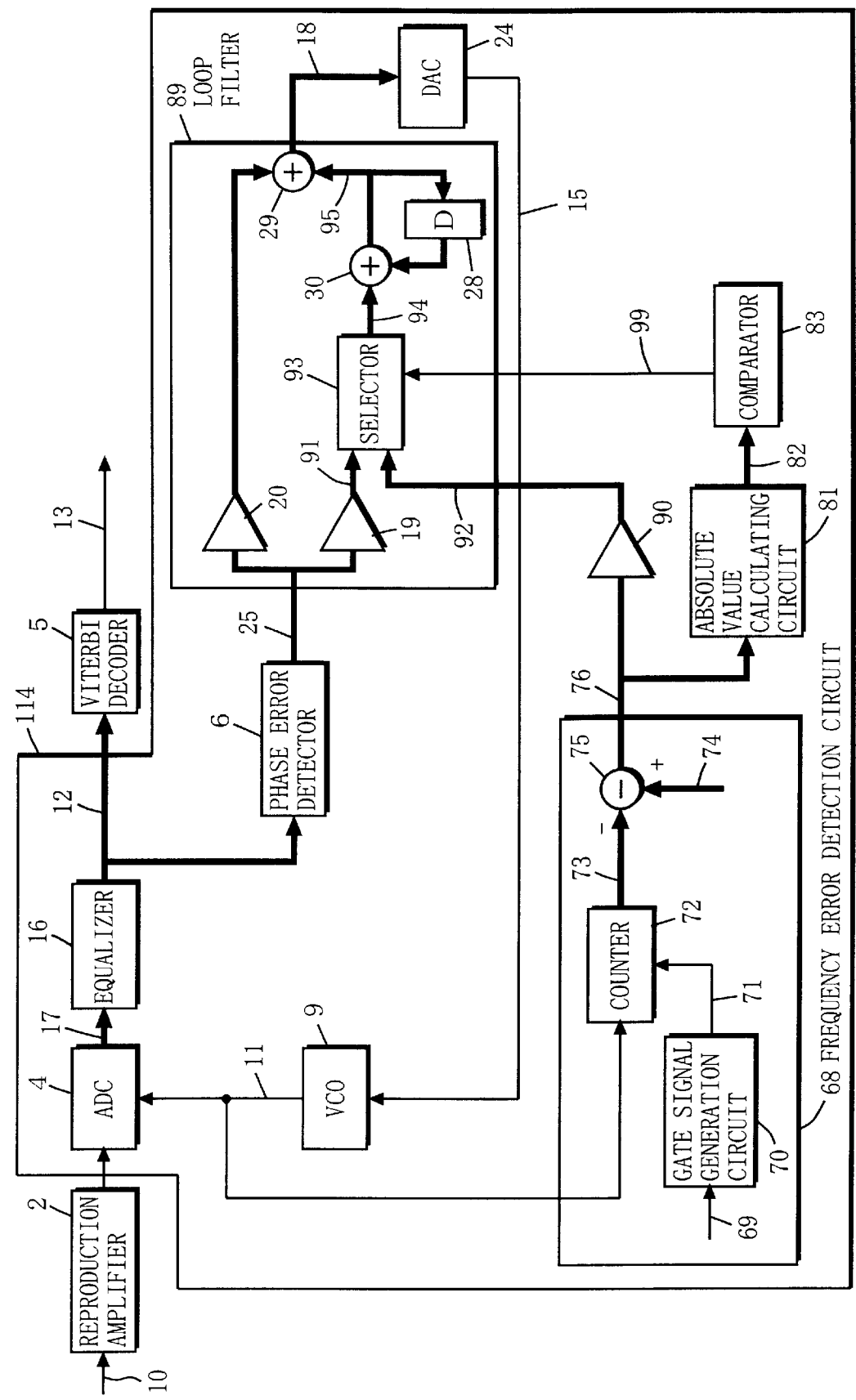
FIG. 16 is a block diagram showing the structure of a reproduction signal processing part, in a signal reproduction apparatus, into which a clock recovery apparatus according to a fourth embodiment of the present invention is incorporated.

FIG. 16 is a block diagram showing the structure of a reproduction signal processing part, in a signal reproduction apparatus, into which a clock recovery apparatus according to a fourth embodiment of the present invention is incorporated. In the reproduction signal processing part shown in FIG. 16, a reference numeral 114 denotes the clock recovery apparatus of the fourth embodiment. The fourth embodiment is different from the second embodiment in FIG. 12 on three respects: the phase-frequency error detection circuit 79 is not provided; a loop filter 89 is provided with both the frequency error judgement signal 99 generated by the absolute circuit 81 and the comparator 83 and the phase error signal 25; and the loop filter 89 includes a selector 93. These differences and effects of the fourth embodiment are described next below.

In the clock recovery apparatus 114 shown in FIG. 16, all of the AD converter 4, the equalizer 16, the phase error detector 6, the DA converter 24, the VCO 9, and the frequency error detection circuit 68 operate similarly to those in the second embodiment. A constant multiplier 90 multiplies the frequency error signal 76 by a given coefficient, and outputs the result as a frequency error multiplication result 92. The absolute value calculating circuit 81 outputs an absolute value of the frequency error signal 76 as the absolute value signal 82. The comparator 83 compares the absolute value signal 82 with the given threshold value $\Delta f$, and outputs, as the frequency error judgement signal 99, a value "0" when the absolute value signal 82 is $\Delta f$ or smaller, and a value "1" when the absolute value signal 82 is larger than $\Delta f$. Both the frequency error multiplication result 92 and the frequency error judgement signal 99 are provided to the loop filter 89.

The loop filter 89 is structured by the constant multiplier 20 in which a response characteristic to the phase error is mainly determined, the constant multiplier 19 in which a response characteristic to the frequency error is mainly determined, the selector 93, the adder 30, the delay circuit 28, and the adder 29. Herein, the adder 30 and the delay circuit 28 structure an integrating circuit, in which a selected output signal 94 being the output signal from the selector 93 is integrated on a clock basis. The selector 93 is provided with the phase-frequency error multiplication result 91 obtained by multiplying the phase error signal 25 by a given coefficient in the constant multiplier 19, and the frequency error multiplication result 92. The selector 93 selects, for output as the selected output signal 94, the phase-frequency error multiplication result 91 when the frequency error judgement signal 99 indicates "0", and the frequency error multiplication result 92 when the frequency error judgement signal 99 indicates "1". The selected output signal 94 is integrated in the integrating circuit structured by the adder 30 and the delay circuit 28. An integrated result signal 95 being the output from the adder 30 is added, in the adder 29, with the result obtained by multiplying the phase error signal 25 by the given coefficient in the constant multiplier 20. The output from the adder 29 is outputted as the filter output signal 18.

With such structure, when the difference in frequency between the data clock and the recovered clock signal 11 being larger than $\Delta f$, the selector 93 selects the frequency error multiplication result 92 being proportionate to the frequency error signal 76, and outputs the same as the selected output signal 94. And the selected output signal 94 is forwarded to the integrating circuit structured by the adder 30 and the delay circuit 28. In this manner, the difference in frequency between the data clock and the recovered clock signal 11 is decreased. With the difference being $\Delta f$ or smaller, the selector 93 selects, instead of the frequency error multiplication result 92, the phase-frequency error multiplication result 91 for output. If $\Delta f$ is previously set to an appropriate value, the PLL circuit starts performing the pull-in operation in a normal manner. Accordingly, the data clock and the recovered clock signal 11 coincide with each other in both frequency and phase.

The effects in the fourth embodiment are described next below. In the second embodiment, when the difference in frequency between the data clock and the recovered clock signal 11 is larger than $\Delta f$, the constant "C" or "−C" is provided to the loop filter 23 regardless of the difference. In the fourth embodiment, however, the value proportionate to the difference in frequency is provided to the integrating circuit in the loop filter 89. In this manner, in addition to the implementation of the wider pull-in range as in the second embodiment, the difference in frequency between the data clock and the recovered clock signal 11 becomes $\Delta f$ or smaller in a shorter time than the second embodiment. As a result, the time taken for the data clock and the recovered clock signal 11 to coincide with each other in frequency and phase is shortened.

(Fifth Embodiment)

Figure 17:
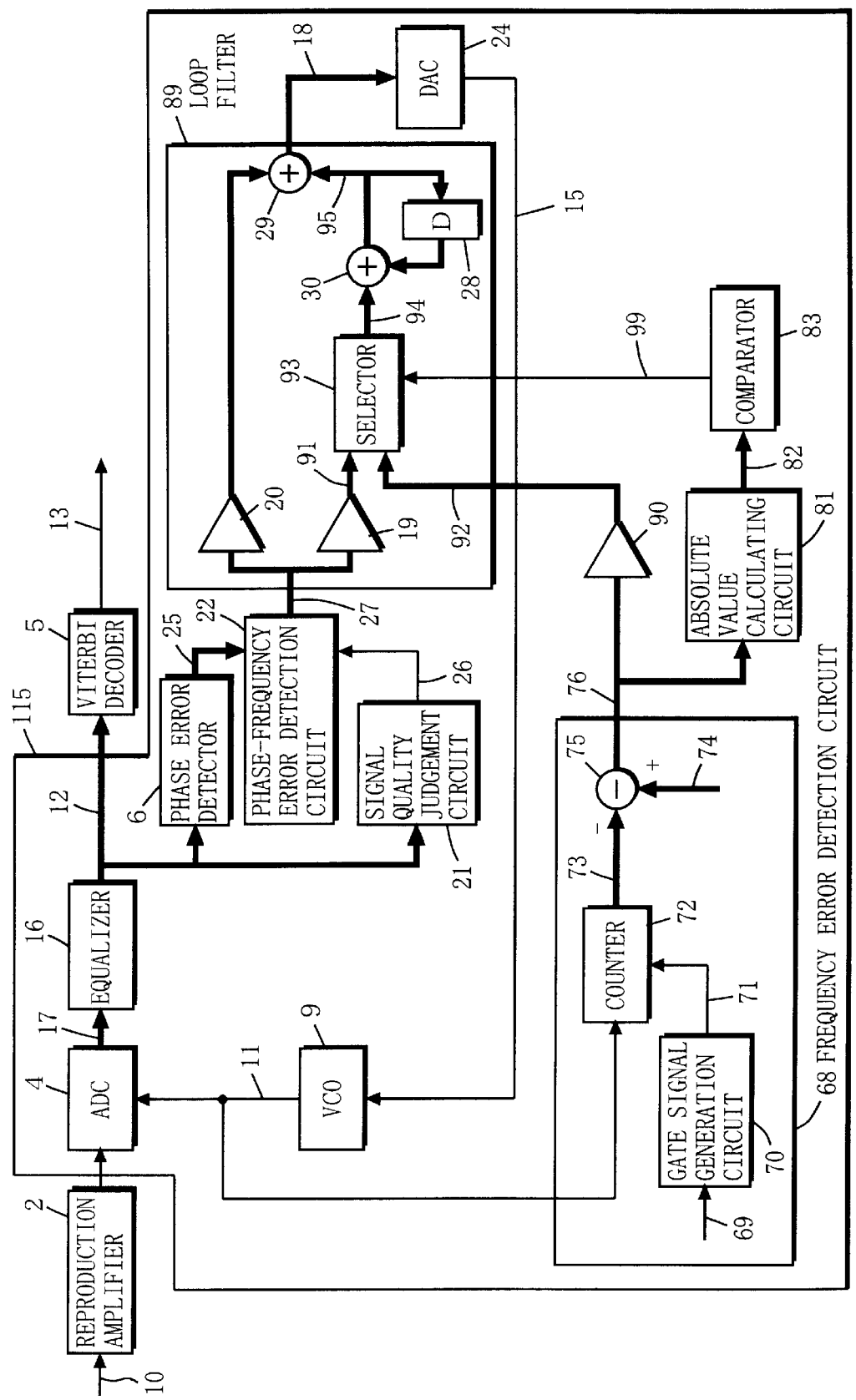
FIG. 17 is a block diagram showing the structure of a reproduction signal processing part, in a signal reproduction apparatus, into which a clock recovery apparatus according to a fifth embodiment of the present invention is incorporated.

FIG. 17 is a block diagram showing the structure of a reproduction signal processing part, in a signal reproduction apparatus, into which a clock recovery apparatus according to a fifth embodiment of the present invention is incorporated. In the reproduction signal processing part shown in FIG. 17, a reference numeral 115 denotes the clock recovery apparatus of the fifth embodiment. The clock recovery apparatus 115 in FIG. 17 bears both of the characteristics of the clock recovery apparatuses 111 and 114 in the first and fourth embodiments in FIGS. 1 and 16. The fifth embodiment is differed from the fourth embodiment in FIG. 16 on two respects: the signal judgement circuit 21 and the phase-frequency error detection circuit 22 are provided; and the phase-frequency error signal 27 is provided to the loop filter 89. In the fourth embodiment, the phase error signal 25 is the one provided to the loop filter 89. These differences and effects of the fifth embodiment are described next below.

In the clock recovery apparatus 115 in FIG. 17, all of the AD converter 4, the equalizer 16, the phase error detector 6, the signal quality judgement circuit 21, the phase-frequency error detection circuit 22, the DA converter 24, and the VCO 9 operate in a similar manner to the ones in the first embodiment, and the frequency error detection circuit 68, the absolute value calculating circuit 81, the comparator 83, the constant multiplier 90, and the loop filter 89 operate in a similar manner to the ones in the fourth embodiment.

With such structure, when the difference in frequency between the data clock and the recovered clock signal 11 is larger than $\Delta f$, the clock recovery apparatus in this embodiment operates similarly to the clock recovery apparatus 114 in the fourth embodiment in FIG. 16. When the difference is equal to or smaller than $\Delta f$, the clock recovery apparatus in this embodiment operates similarly to the clock recovery apparatus 111 in the first embodiment. Thereby, when the difference is larger than $\Delta f$, with the operation similar to the clock recovery apparatus 114 in the fourth embodiment, the difference is decreased to be $\Delta f$ or smaller. Thereafter, with the operation similar to the clock recovery apparatus 111 in the first embodiment, the data clock and the recovered clock signal 11 coincide with each other in both frequency and phase.

The effects in the fifth embodiment are described next below. In the first embodiment, the PLL circuit may not properly perform the pull-in operation if the difference in frequency between the data clock and the recovered clock signal 11 is considerably large. On the other hand, in the fifth embodiment, even if the difference in frequency between the data clock and the recovered clock signal 11 is considerably large, the PLL circuit accurately performs the pull-in operation in a shorter time. This is because, the difference in frequency is detected based on the reference clock signal 69 in a similar manner to the fourth embodiment. Further, in the fourth embodiment, the PLL circuit starts performing the pull-in operation in a normal manner after the difference in frequency between the data clock and the recovered clock signal 11 being Δf or smaller. Therefore, it is required to set Δf small enough to have the PLL circuit properly perform the pull-in operation, and to improve the accuracy of the frequency of the reference clock signal 69 and the reference count value 74. The clock recovery apparatus in the fifth embodiment, on the other hand, operates in a similar manner to the first embodiment after the difference in frequency between the data clock and the recovered clock signal 11 becoming Δf or smaller. Therefore, the value of Δf can be relatively larger therein. In this manner, there is no more need to improve the accuracy of the frequency of the reference clock signal 69 and the reference count value 74, and accordingly circuitry can be easily implemented. Herein, the signal quality judgement circuit 21 in FIG. 17 may be structured as shown in FIG. 4 or FIG. 8. For the absolute value calculating circuit 40 in FIG. 4 or the absolute value calculating circuit 52 in FIG. 8, a circuit for calculating a square may be alternatively used. Further, the phase-frequency error detection circuit 22 may be structured as shown in FIG. 5, 9, or 10.

(Sixth Embodiment)

In the clock recovery apparatus in the first and fifth embodiments of the present invention, as in the second conventional clock recovery apparatus in FIG. 20, the digital equalizer is provided in the feedback loop in the PLL circuit. Alternatively, as in the first conventional clock recovery apparatus in FIG. 19, an analog equalizer may be provided outside of the feedback loop in the PLL circuit.

FIG. 18 is a block diagram showing the structure of a reproduction signal processing part, in a signal reproduction apparatus, into which a clock recovery apparatus according to a sixth embodiment of the present invention is incorporated. In the reproduction signal processing part shown in FIG. 18, a reference numeral 116 denotes the clock recovery apparatus of the sixth embodiment. The clock recovery apparatus 116 in FIG. 18 is different from the clock recovery apparatus 111 in the first embodiment in FIG. 1 on a respect that the equalizer is an analog circuit. According to the sixth embodiment, in addition to the same effects as in the first embodiment, it is easy to implement only by adding an external circuit to the well-known first conventional reproduction signal processing part of the signal processing apparatus.

Note that, FIG. 18 shows an exemplary modification for the clock recovery apparatus 111 of the first embodiment. Similar modification may be applied to the clock recovery apparatuses in the second to fifth embodiments.

While the invention has been described in detail, the foregoing description is in all aspects illustrative and not restrictive. It is understood that numerous other modifications and variations can be devised without departing from the scope of the invention.

What is claimed is:

1. A clock recovery apparatus for recovering a clock signal used to reproduce digital data from an incoming signal, said apparatus comprising:

an oscillation device operable to receive a control signal, and generate, as an oscillation clock signal, a clock signal having a frequency based on the control signal;

a sampling device operable to sample the incoming signal with a timing of the oscillation clock signal, and output a sampled value of the incoming signal;

a phase error detection device operable to detect, based on the sampled value, a phase error between the oscillation clock signal and an ideal clock signal used to reproduce the digital data;

a frequency error detection device operable to detect a difference between a frequency of the oscillation clock signal and a given reference frequency as a frequency error;

a selection device operable to select the phase error when an absolute value of the frequency error is smaller than a given threshold value, and select the frequency error when the absolute value of the frequency error is larger than the threshold value;

an integration device operable to integrate an output of said selection device; and an addition device operable to add the phase error from said phase error detection device and an output of said integration device for output as the control signal to said oscillation device;

wherein the oscillation clock signal is outputted as the clock signal used to reproduce the digital data.

2. The clock recovery apparatus as claimed in claim 1, wherein said frequency error detection device includes a count device operable to count the oscillation clock signals generated during a given time, and regard a difference between a count value obtained by said count device and a given expected value as the frequency error.

3. The clock recovery apparatus as claimed in claim 1, wherein said sampling device includes an equalization device operable to equalize the incoming signal sampled by the oscillation clock signal for output as the sampled value.

4. A clock recovery apparatus for recovering a clock signal used to reproduce digital data from an incoming signal, said apparatus comprising:

an oscillation device operable to receive a control signal, and generate, as an oscillation clock signal, a clock signal having a frequency based on the control signal;

a sampling device operable to sample the incoming signal with a timing of the oscillation clock signal, and output a sampled value of the incoming signal;

a phase error detection device operable to detect, based on the sampled value, a phase error between the oscillation clock signal and an ideal clock signal used to reproduce the digital data;

a quality judgement device operable to judge a quality of the sampled incoming signal by referring to the sampled value;

a phase-frequency error detection device operable to output a phase-frequency error signal based on the phase error and the quality judged by said quality judgement device;

a frequency error detection device operable to detect a difference between a frequency of the oscillation clock signal and a given reference frequency as a frequency error;

a selection device operable to select the phase-frequency error signal when an absolute value of the frequency error is smaller than a given threshold value, and select the frequency error when the absolute value of the frequency error is larger than the threshold value;

an integration device operable to integrate an output of said selection device; and an addition device operable to add the phase-frequency error signal from said phase-frequency error detection device and an output of said integration device for output as the control signal to said oscillation device;

wherein the oscillation clock signal is outputted as the clock signal used to reproduce the digital data.

5. The clock recovery apparatus as claimed in claim 4, wherein said quality judgement device comprises:

a temporary judgement device operable to estimate the digital data based on the sampled value for output as a temporary judgement result;

a reference value generation device operable to generate a reference value based on the temporary judgement result; and a calculation device operable to calculate a difference between the sampled value and the reference value;

wherein the quality is judged according to the difference.

6. The clock recovery apparatus as claimed in claim 5, wherein said reference value generation device is operable to generate the reference value which corresponds to a change in amplitude of the sampled incoming signal.

7. The clock recovery apparatus as claimed in claim 5, wherein said quality judgement device is operable to compare a value based on an absolute value of the difference with a given threshold value, and accordingly determine the quality.

8. The clock recovery apparatus as claimed in claim 5, wherein said quality judgement device is operable to compare a value based on a square of the difference with a given threshold value, and accordingly determine the quality.

9. The clock recovery apparatus as claimed in claim 5, wherein said quality judgement device includes a low pass filter, is operable to compare a value obtained after the difference goes through said low pass filter with a given threshold value, and accordingly judge the quality.

10. The clock recovery apparatus as claimed in claim 4, wherein, according to the judgement made by said quality judgement device, said phase-frequency error detection device takes in, for retention, a sign of the phase error every time the quality changes from good to bad, and outputs the phase error when the quality is good but outputs a given error value corresponding to the retained sign when the quality is bad.

11. The clock recovery apparatus as claimed in claim 4, wherein said phase-frequency error detection device includes a phase error filter device operable to smooth the phase error, and according to the judgement made by said quality judgement device, take in, for retention, a sign of an output signal of said phase error filter device every time the quality changes from good to bad, and when the quality is good, output the phase error, but when the quality is bad, output a given error value corresponding to the retained sign.

12. The clock recovery apparatus as claimed in claim 4, wherein said phase-frequency error detection device includes a phase error filter device operable to smooth the phase error, and according to the judgement made by said quality judgement device, take in, for retention, a sign of an output signal of said phase error filter device every time the quality changes from good to bad, and when the quality is good, output the phase error, but when the quality is bad, output a given error value according to the retained sign for a given duration of time right after the quality is judged as being bad.

13. The clock recovery apparatus as claimed in claim 4, wherein said frequency error detection device includes a count device operable to count the oscillation clock signals generated during a given time, and output a difference between a count value obtained by said count device and a given expected value as the frequency error.

14. The clock recovery apparatus as claimed in claim 4, wherein said sampling device includes an equalization device operable to equalize the incoming signal sampled by the oscillation clock signal for output as the sampled value.

* * * * *